(12) United States Patent
Kasai

(10) Patent No.: US 11,187,842 B2
(45) Date of Patent: *Nov. 30, 2021

(54) LIGHT EMITTING MODULE

(71) Applicant: NICHIA CORPORATION, Anan (JP)

(72) Inventor: Daisuke Kasai, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/076,150

(22) Filed: Oct. 21, 2020

(65) Prior Publication Data

US 2021/0055469 A1 Feb. 25, 2021

Related U.S. Application Data

(63) Continuation of application No. 16/729,356, filed on Dec. 28, 2019, now Pat. No. 10,845,527.

(30) Foreign Application Priority Data

Dec. 28, 2018 (JP) .............................. JP2018-248691

(51) Int. Cl.
*F21V 8/00* (2006.01)
*H01L 33/54* (2010.01)
(Continued)

(52) U.S. Cl.
CPC ......... *G02B 6/0045* (2013.01); *G02B 6/0021* (2013.01); *G02B 6/0055* (2013.01);
(Continued)

(58) Field of Classification Search
CPC ......... H01L 33/52; H01L 33/54; H01L 33/56; G02B 6/0021
See application file for complete search history.

(56) References Cited

U.S. PATENT DOCUMENTS 8,013,352 B2  9/2011 Lee
2006/0097291 A1  5/2006 Takahashi
(Continued)

FOREIGN PATENT DOCUMENTS

DE   102013102967 A1   9/2014
JP   2007311445 A   11/2007
(Continued)

*Primary Examiner* — Alexander K Garlen
(74) *Attorney, Agent, or Firm* — Hunton Andrews Kurth LLP

(57) ABSTRACT

A light emitting module includes: a light emitting element unit including: a light-emitting element that has a main-light-emission surface, an electrode-formation surface and a side-surface, a light-transmissive member that covers the main-light-emission surface, and a first light-reflection member that covers the side-surface; a light-transmissive light guide plate including a first main-surface as a light emission surface, and a second main-surface opposed to the first main-surface and has a recess accommodating the light emitting element unit so that the first light-reflection member is partially arranged out of the recess in a cross-section; a light-transmissive interposition member that contacts an interior side-surface of the recess and an exterior side-surface of the light emitting element unit; and a second light-reflection member that partially covers the second main-surface and the interposition member. The interposition member is at least partially exposed from the second light-reflection member in a plan view. The hardness of the interposition member is lower than a hardness of the first light-reflection member and a hardness of the second light-reflection member.

20 Claims, 20 Drawing Sheets

(51) Int. Cl.
*H01L 33/60* (2010.01)
*F21Y 105/16* (2016.01)

(52) U.S. Cl.
CPC .............. *H01L 33/54* (2013.01); *H01L 33/60* (2013.01); *F21Y 2105/16* (2016.08)

(56) References Cited

U.S. PATENT DOCUMENTS

| | | |
|---|---|---|
| 2007/0121340 A1 | 5/2007 | Hoshi |
| 2007/0205425 A1* | 9/2007 | Harada .................. H01L 33/58 257/98 |
| 2007/0267643 A1 | 11/2007 | Harada et al. |
| 2009/0174300 A1 | 7/2009 | Jousse |
| 2011/0149594 A1 | 6/2011 | Terajima et al. |
| 2013/0188381 A1* | 7/2013 | Kotani .................. H01L 33/50 362/517 |
| 2015/0338048 A1 | 11/2015 | Ahn |
| 2017/0261161 A1 | 9/2017 | Moon |
| 2018/0151785 A1* | 5/2018 | Hashimoto ............ H01L 33/60 |
| 2018/0239193 A1 | 8/2018 | Hayashi |
| 2018/0311935 A1 | 11/2018 | Sahyou |
| 2019/0018184 A1 | 1/2019 | Miyashita et al. |
| 2020/0209462 A1 | 7/2020 | Kasai |

FOREIGN PATENT DOCUMENTS

| | | |
|---|---|---|
| JP | 2009140663 A | 6/2009 |
| JP | 2011210674 A | 10/2011 |
| JP | 2018097974 A | 6/2018 |
| JP | 2018133304 A | 8/2018 |
| WO | 2017122794 A1 | 7/2017 |

* cited by examiner

LIGHT EMITTING MODULE

CROSS-REFERENCE TO RELATED APPLICATION

This is a continuation application of U.S. patent application Ser. No. 16/729,356, filed Dec. 28, 2019, which claims priority under 35 U. S. C. § 119 to Japanese Patent Application No. 2018-248,691, filed on Dec. 28, 2018, the content of which is incorporated herein by references in their entirety.

BACKGROUND

1. Field of the Invention

The present disclosure relates to a light emitting module that includes a light emitting element.

2. Description of the Related Art

Light emitting devices that include light emitting elements such as light emitting diodes are widely used as backlights for liquid crystal displays, and light sources in various types of displays or the like. For example, a light source is disclosed in Japanese Patent Publication No. JP 2015-32,373 that includes a mount substrate, a plurality of light emitting elements, a plurality of hemispherical lens member, and a light diffusion member. The light emitting elements are mounted onto the mount substrate. The hemispherical lens members seal their corresponding light emitting element. The light diffusion member is arranged on the lens members so that light from the light emitting elements enters the light diffusion member. Also, a light emitting device is disclosed in Japanese Patent Publication No. JP 2016-115,703 that includes a light emitting element, a two-layer sheet, and a reflection resin. The two-layer sheet is arranged on the upper surface of the light emitting element, and is constructed of laminated sealing resin and phosphor layers which are integrally formed as one member. The reflection resin covers the side surfaces of the two-layer sheet.

However, such light emitting devices emit a large amount of heat. The resin materials of the light emitting devices repeatedly expand and contract when heated. The repeated expansion and contraction may cause a crack in the light emitting device.

Therefore, it is an object of certain embodiments of the present invention to provide a light emitting module that has improved reliability.

SUMMARY

A light emitting module according certain aspect of the present invention includes a light emitting element unit, a light-transmissive light guide plate, a light-transmissive interposition member, and a second light reflection-member. The light emitting element unit includes a light emitting element, a light-transmissive member, and a first light-reflection member. The light emitting element has an element main-light-emission surface, an element electrode-formation surface opposed to the element main-light-emission surface, and an element side-surface extending between the element main-light-emission surface and the element electrode-formation surface. The light-transmissive member covers the element main-light-emission surface. The first light-reflection member covers the element side-surface. The light-transmissive light guide plate has a light-guide first main-surface and a light-guide second main-surface. The light-guide first main-surface serves as a light emission surface through which light exits. The light-guide second main-surface is opposed to the light-guide first main-surface, and has a recessed part. The recessed part accommodates the light emitting element unit. The first light-reflection member is at least partially arranged out of the recessed part in a vertical cross-sectional view. The light-transmissive interposition member contacts an interior side-surface of the recessed part and an exterior side-surface of the light emitting element unit. The second light reflection-member covers a part of the light-guide second main-surface and a part of the interposition member. As viewed in a plan view from the light-guide second main-surface, the first light-reflection member and the second light-reflection member are at least partially spaced away from each other, and the interposition member is exposed from the second light-reflection member in the spaced area. The hardness of the interposition member is lower than a hardness of the first light-reflection member and lower than a hardness of the second light-reflection member.

According to certain embodiments of the present disclosure, first and second light-reflection members are not directly fixed to each other so that a lower-hardness interposition member is arranged at an interposition part between the first and second light-reflection members. Accordingly, even if they expand/contract when heated, the higher-hardness first and second light-reflection members can be prevented from rubbing against each other. In addition, the lower-hardness interposition member can absorb their deformation. As a result, crack generation can be suppressed. Therefore, the durability can be increased.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, in which.

DETAILED DESCRIPTION

Figure 1:
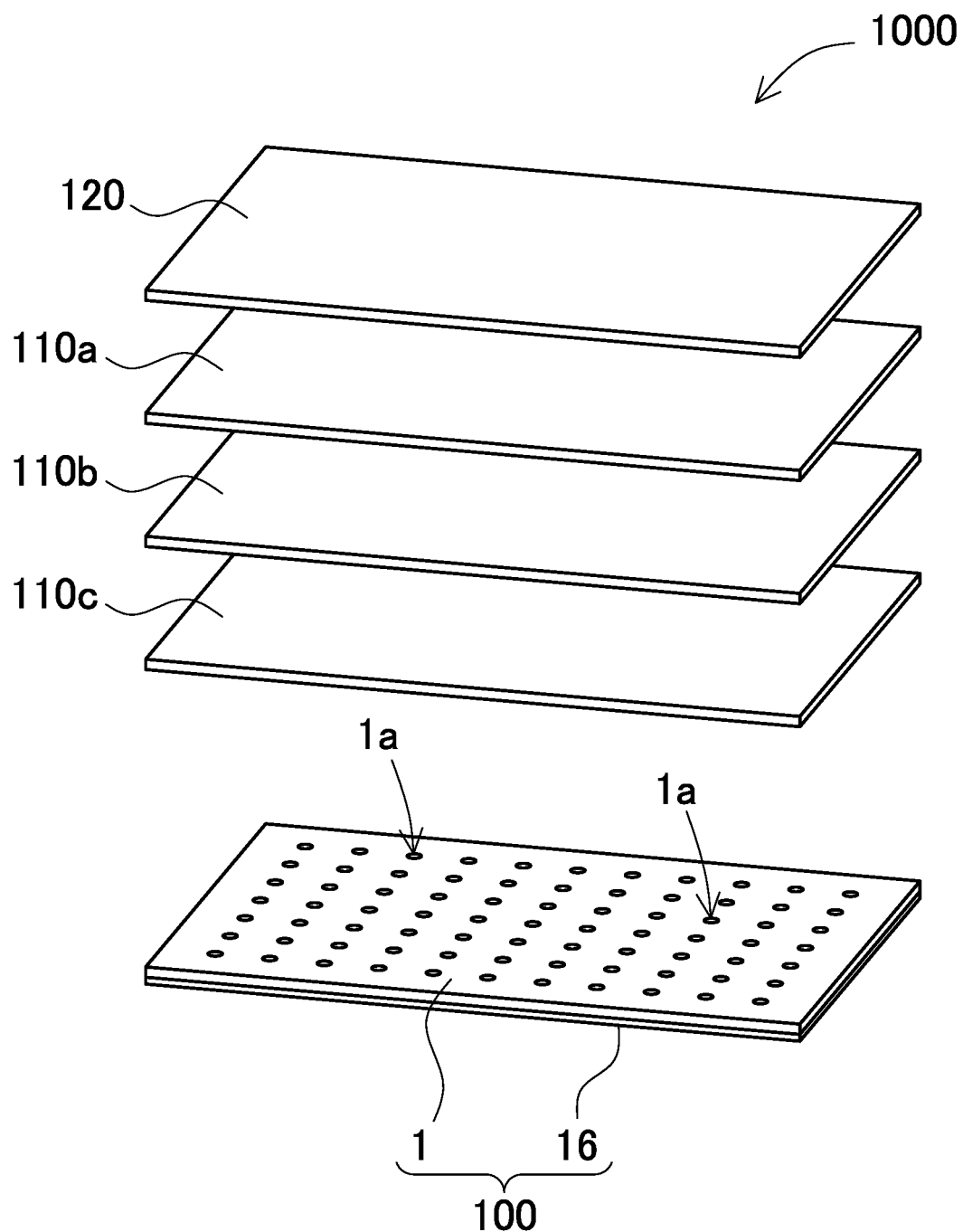
FIG. 1 is a schematic view showing components of a liquid crystal display according to a first embodiment of the present disclosure.

According to a light emitting module of an embodiment of the present disclosure, the hardness of the second light-reflection member can be not smaller than the first light-reflection member.

According to a light emitting module of another embodiment of the present disclosure, the first and second light-reflection members, and the interposition member can include a resin.

According to a light emitting module of another embodiment of the present disclosure, the light emitting element unit may have a roughly rectangular shape in a plan view. The interposition member can have a width at the ends of a side of the rectangular light emitting element unit smaller than in the central part of this side, which is located between these ends, in a plan view.

According to a light emitting module of another embodiment of the present disclosure, the second light-reflection member can have a second light-reflecting connection surface that faces the light-guide second main-surface of the light guide plate, and a second light reflection main-surface that is opposed to the second light-reflecting connection surface. The interface between the interposition member and the second light-reflection member on the second light reflection main-surface can be located outside the end surface of the light-transmissive member in a vertical cross-sectional view.

According to a light emitting module of another embodiment of the present disclosure, the second light-reflection member can have a second light-reflecting connection surface that faces the light-guide second main-surface of the light guide plate, and a second light reflection main-surface that is opposed to the second light-reflecting connection surface. The interface between the interposition member and the second light-reflection member on the second light reflection main-surface can be located outside the end surface of the recessed part in a vertical cross-sectional view.

According to a light emitting module of another embodiment of the present disclosure, light emitting element units and interposition members can be provided as the light emitting element unit and the interposition member. The light guide plate can have a plurality of recessed parts as the recessed part for accommodating their corresponding light emitting element unit and interposition member. An interface between the interposition member and the second light-reflection member can be inclined in a vertical cross-sectional view.

According to a light emitting module of another embodiment of the present disclosure, the inclined surface of the interposition member can be a concave surface.

According to a light emitting module of another embodiment of the present disclosure, the inclined surface of the interposition member can be a convex surface.

According to a light emitting module of still another embodiment of the present disclosure, the light guide plate can have a plurality of recessed parts as the recessed part. The light emitting element unit and the interposition member can be arranged in their corresponding the recessed part. The second light-reflection member can be arranged between the interposition members. An interface between the interposition member and the second light-reflection member can be inclined in a vertical cross-sectional view.

The following description will describe embodiments according to the present disclosure with reference to the drawings. In the following description, although terms for indicating particular directions or positions (e.g., "upper" and "lower", and other terms including these terms) will be used as necessary for ease of understanding the present with reference to the drawings, the technical scope of the present disclosure is not limited by these terms.

It should be appreciated, however, that the embodiments described below are illustrations of a light emitting module to give a concrete form to technical ideas of the disclosure, and a light emitting module of the disclosure is not specifically limited to description below. Unless otherwise specified, any dimensions, materials, shapes and relative arrangements of the parts described below are given as an example and not as a limitation. In addition, the description for certain embodiment may be applied to other embodiments or examples. Additionally, the sizes and the arrangement relationships of the members in the drawings are occasionally exaggerated for ease of explanation.

First Embodiment

Liquid Crystal Display 1000

FIG. 1 is a schematic view showing components of a liquid crystal display 1000 which includes a light emitting module 100. The liquid crystal display 1000 includes a liquid crystal panel 120, two lens sheets 110a and 110b, a light diffusion sheet 110c, and the light emitting module 100 in this order from the top side. The liquid crystal display 1000 shown in FIG. 1 is a so-called direct-backlight type liquid crystal display, which includes the liquid crystal panel 120 and the light emitting module 100 arranged under the liquid crystal panel 120. The liquid crystal panel 120 is irradiated with light which is emitted by the light emitting module 100 in the liquid crystal display 1000. The liquid crystal panel can include a polarizing film, a color filter, and the like in addition to the aforementioned components.

Light Emitting Module 100

Figure 2:
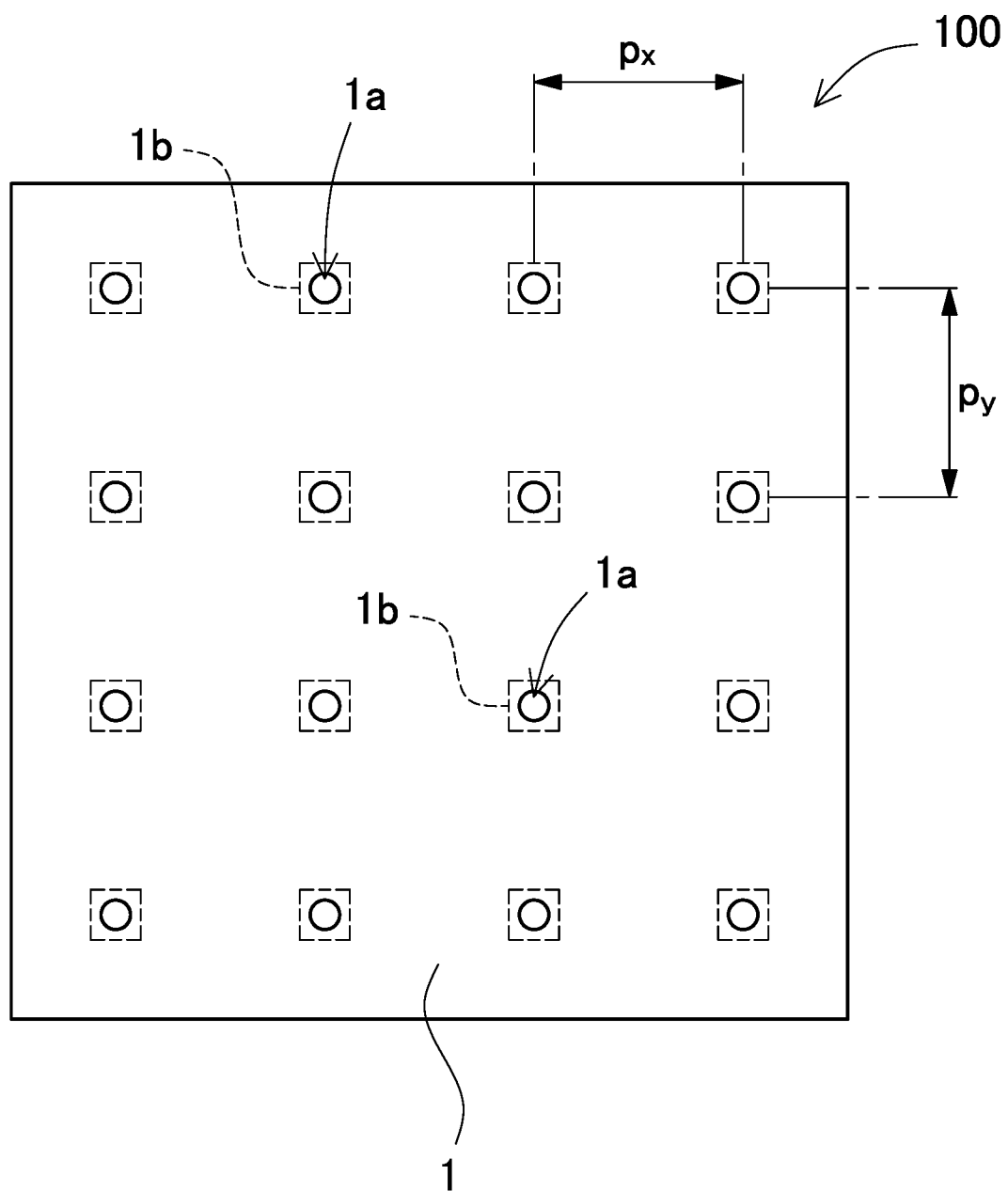
FIG. 2 is a schematic plan view showing a light emitting module according to the first embodiment of the present disclosure.
Figure 3:
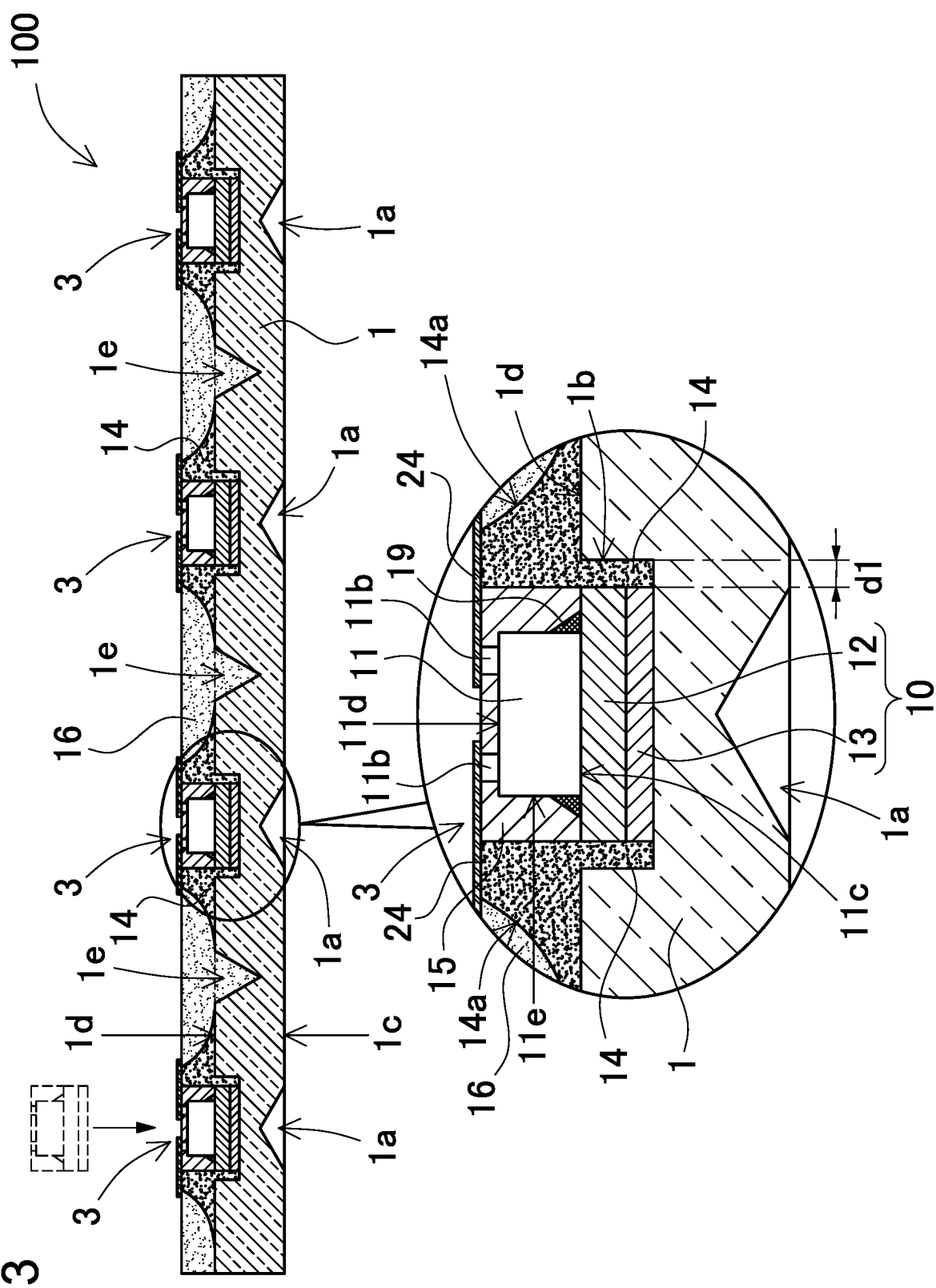
FIG. 3 is a schematic cross-sectional view showing the light emitting module according to the first embodiment of the present disclosure with its light guide plate being orientated downward together with a partially enlarged view of the principal part of the light emitting module.

FIGS. 2 and 3 show the construction of the light emitting module 100 according to this embodiment. The light emitting module 100 according to this embodiment is a surface-emission-type white-light emitting module. FIG. 2 is a schematic plan view showing the light emitting module 100 according to this embodiment. FIG. 3 is a schematic cross-sectional view with a partially enlarged cross-sectional view showing the light emitting module 100 according to this embodiment. The illustrated light emitting module 100 includes light emitting element units 3 (hereinafter also referred to as light-emitting devices) as light sources, and a light guide plate 1. The light guide plate 1 has light-guide first and second main-surfaces 1c and 1d. The light-guide first main-surface 1c serves as a light emission surface through which light exits. The light-guide second main-surface 1d has recessed parts 1b which accommodate their corresponding light-emitting device 3. In addition, the light emitting module 100 includes a second light-reflection member 16 which covers a part of the light-guide second main-surface 1d of the light guide plate 1 and a part of the light-emitting devices 3. Also, the light emitting module 100 includes light-transmissive interposition members 14 which contact the interior side-surfaces of their corresponding recessed part 1b and the exterior side-surfaces of their corresponding light emitting device 3.

In the light emitting module 100 shown in FIGS. 2 and 3, the recessed parts 1b are formed on one sheet of light guide plate 1. The light emitting devices 3 are accommodated in their corresponding recessed part 1b. Also, the light emitting module 100 can be replaced with a light emitting module 100' which includes a number of light-emitting-module parts each of which is formed of a light guide plate 1' having one recessed part 1b as shown in a schematic bottom view of FIG. 4. The light-emitting device 3 is accommodated in the recessed part 1b. The light-emitting-module parts are arranged in a matrix arrangement.

Light Emitting Device 3

FIG. 3 is a schematic cross-sectional view of the light emitting device 3. This illustrated light emitting device 3 includes a light emitting element 11, a light-transmissive member 10, a light-transmissive adhesion member 19, and a first light-reflection member 15. The light-transmissive member 10 is fixed onto the light emitting element 11 by the light-transmissive adhesion member 19. The first light-reflection member 15 covers the element side-surfaces 11e of the light emitting element 11. The light-transmissive member 10 covers an element main-light-emission surface 11c of the light emitting device 3. The light-transmissive member 10 has a third main surface 12c which is connected to the element main-light-emission surface 11c, a fourth main surface 12d, and second side surfaces 12e which extend between the third and fourth main surfaces 12c and 12d. The third main surface 12c has a rectangular shape having an area larger than the element main-light-emission surface 11c, and is connected to the element main-light-emission surface 11c. The light-transmissive member 10 includes a wavelength conversion member 12 which is excited by light emitted by the light emitting element 11, and emits light having a wavelength different from the light of the light emitting element 11.

Light Emitting Element 11

The light emitting element 11 has the element main-light-emission surface 11c, an element electrode-formation surface 11d which is opposed to the element main-light-emission surface 11c, and element side-surfaces 11e which extend between the element main-light-emission surface 11c and the element electrode-formation surface 11d. A pair of element electrodes 11b are arranged on the element electrode-formation surface 11d. The light emitting element 11 emits light mainly from the light emission surface 11c, and irradiates the light-transmissive member 10, which covers the element main-light-emission surface 11c, with the light.

The light-transmissive member 10 covers the element main-light-emission surface 11c of the light emitting element 11 in the light emitting device 3 shown in FIG. 3. The element side-surfaces 11e of the light emitting element 11 are covered by the first light-reflection member 15 in the light emitting device 3. In the illustrated light emitting device 3, the exterior side-surface of the first light-reflection member 15 is substantially coplanar with the exterior side-surface of the light-transmissive member 10.

The light emitting element 11 has the element electrode-formation surface 11d and the element main-light-emission surface 11c. The pair of electrodes (positive/negative element electrodes) 11b are formed on the element electrode-formation surface 11d. The element main-light-emission surface 11c is located on the side opposed to the element electrode-formation surface 11d. The light emitting module according to this embodiment can be mounted on electrically conductive members in a flip chip mounting manner or be electrically connected to electrically conductive members by wires.

The light emitting element 11 includes a light-transmissive substrate such as sapphire, and a laminated semiconductor structure that is deposited on the light-transmissive substrate, for example. The laminated semiconductor structure includes a light-emitting layer, and n-type and p-type semiconductor layers. The light-emitting layer is interposed between the n-type and p-type semiconductor layers. N-side and p-side electrodes, which are the element electrodes 11b, are electrically connected to the n-type and p-type semiconductor layers, respectively. In the light emitting element 11, the element main-light-emission surface 11c which can be the surface of the light-transmissive substrate is opposed to the light guide plate 1, for example. The pair of element electrodes 11b are formed on the element electrode-formation surface 11d opposed to the element main-light-emission surface 11c.

Although the dimensions including length, width, and height of the light emitting element 11 are not specifically limited, the light emitting element 11 is preferably formed of a semiconductor and preferably has a length and width not greater than 1000 µm as viewed in a plan view. The light emitting element 11 more preferably has a length and width not greater than 500 µm, still more preferably not greater than 200 µm. In the case in which the light emitting element 11 has dimensions falling within these ranges, the liquid crystal display can realize high definition images by local dimming. In particular, in the case in which the light emitting elements have a length and width not greater than 500 μm, the light emitting elements can be inexpensively purchased. Therefore, the light emitting module 100 can be inexpensively produced. In the case in which the light emitting elements 11 have a length and width not greater than 250 μm, the area of the upper surface of the light emitting element 11 is small. As a result, the amount of light emitted from the element side-surfaces 11e of the light emitting element 11 will relatively increase. That is, this light emitting element is likely to emit light in a batwing shape. For this reason, this light emitting element is suitably used for the light emitting module which has a very short dimension between the light emitting element and the light guide plate when the light emitting element is fixed onto the light guide plate.

Also, the light emitting element 11 preferably has a height of 0.30 to 0.40 mm. The height of the light emitting element 11 is preferably dimensioned so that the element electrode-formation surface 11d of the light emitting element 11 is positioned outside the recessed part 1b when the light emitting device 3 is mounted in the recessed part 1b.

The light emitting element 11 may have any shape as viewed in a plan view. For example, the light emitting element 11 can have a square or rectangular shape. The light emitting elements to be used for high definition liquid crystal displays preferably have a rectangular shape. Accordingly, their upper surface has longer and shorter sides. In a high definition liquid crystal display, the number of the light emitting elements to be used is thousands or more. The process for mounting the light emitting elements is important. Even if rotational deviation (e.g., ±90 degrees deviation) occurs to some of the light emitting elements in the process for mounting the light emitting elements, such rectangular light emitting elements as viewed in a plan view make visual inspection easy. In addition, because the p-side and n-side electrodes can be spaced at a certain distance away from each other, wiring discussed later can be easily formed. Contrary to this, in the case in which light emitting elements having a square shape in a plan view are used, small light emitting elements can be efficiently produced in volume. The density (pitch) of the light emitting elements 11, that is, the distance between the light emitting elements 11 can be approximately from 0.05 to 20 mm, preferably approximately from 1 to 10 mm, for example. The pitch between the light emitting elements 11 is the distance from the center to the center of two adjacent light emitting elements 11. The light emitting elements 11 are arranged substantially at the center of their corresponding light emitting device 3. Accordingly, the pitch between the light emitting devices 3 is dimensioned approximately 0.05 to 20 mm and preferably 1 to 10 mm.

Well-known semiconductor light emitting elements can be used as the light emitting elements 11. In this embodiment, the flip-chip-mounted light emitting diodes are illustratively used as the light emitting elements 11. The light emitting elements 11 emit blue light, for example. Elements which emit light other than blue can be also used as the light emitting elements 11. Also, two or more light emitting elements which emit light with different colors can be used as the light emitting elements 11. The color of light emitted by the light emitting element 11 is adjusted to a desired color to be emitted outward by the wavelength conversion member 12.

Elements which emit light having any wavelength can be selectively used as the light emitting elements 11. For example, light emitting elements which are formed of nitride group semiconductors ($In_xAl_yGa_{1-x-y}N$, $0 \leq x$, $0 \leq y$, $x+y \leq 1$) or GaP can be used as an element which emits blue or green light. Light emitting elements which are formed of semiconductors such as GaAlAs and AlInGaP can be used as an element which emits red light. Semiconductor light emitting devices can also be used which are formed of materials other than these materials. The light wavelength of a semiconductor layer can be varied by changing the mixture ratio between its materials. The composition, the light color, the size, the number, and the like of the light emitting elements to be used can be suitably selected depending on the purpose.

Light-Transmissive Member 10

The light-transmissive member 10 covers the element main-light-emission surface 11c of the light emitting element 11. The light emitted from the element main-light-emission surface 11c passes through the light-transmissive member 10. The light-transmissive member 10 can include a material which is excited by the light emitted by the light emitting element 11, and a light diffusion or/and reflection material. The light-transmissive member 10 shown in FIG. 3 includes the wavelength conversion member 12 and a light diffusion portion 13 which is laminated on the wavelength conversion member 12. In the illustrated light-transmissive member 10, the wavelength conversion member 12 is located on the light-emitting-element 11 side, and the light diffusion portion 13 is arranged on the light guide plate 1 side. This light-transmissive member 10 adjusts the wavelength of light that is emitted by the light emitting element 11 by using the wavelength conversion member 12, and diffuses light that exits the wavelength conversion member 12 by using the light diffusion portion 13 so that the light guide plate 1 is irradiated with the light. As a result, light can more uniformly exit the light guide plate 1.

In the light emitting device 3 shown in FIG. 3, the light-transmissive member 10, which includes the wavelength conversion member 12 and the light diffusion portion 13, is fixed onto the light emitting element 11. This light-transmissive member 10 which includes the wavelength conversion member 12 and the light diffusion portion 13 is preferable. The light-transmissive member 10 may include two or more wavelength conversion members 12 and two or more light diffusion portions 13 which are laminated on one after another. Also, the light-transmissive member 10 may be formed of only the wavelength conversion member or light diffusion portion. Alternatively, the light-transmissive member 10 may be formed of only a light-transmissive resin with neither the light-transmissive member nor the light diffusion portion. The light emitting element 10 preferably has a thickness within the range 0.10 to 0.30 mm. If the light-transmissive member is too thin, it will be unlikely to provide the wavelength conversion or light diffusion effect. Contrary to this if too thick, a problem may arise such as light absorption by the wavelength conversion, saturation of light diffusion effect, and the like. For these reasons, it is preferable that the thickness of the light-transmissive member 10 including the wavelength conversion member 12 and the light diffusion portion 13 falls within the aforementioned range.

Wavelength Conversion Member 12

The wavelength conversion member 12 serves to convert light that is emitted by the light emitting element 11 into light having a different wavelength. The wavelength conversion member 12 is formed of a fourth resin as base material and a wavelength conversion material which is distributed in the fourth resin. The wavelength conversion member 12 may be constructed of two or more layers. For example, the wavelength conversion member 12 can have a two-layer structure which is constructed of first and second layers. The first layer can be formed of a base material and a wavelength conversion material which is added into the base material. The second layer can be a light diffusion portion formed of a base material and a light diffusion material which is added into the base material.

Exemplary materials of the fourth resin as base material may include light-transmissive materials such as epoxy resin, silicone resin, mixed resin of these resins, glass, and the like. Silicone resin is advantageously used as the fourth resin from the viewpoint of light resistance and ease of formation of the wavelength conversion member 12. A material which has a refractive index higher than the material of the light guide plate 1 is preferably used as the base material of the wavelength conversion member 12.

A phosphor may be suitably used as the wavelength conversion material to be included in the wavelength conversion member 12. Exemplary materials of the wavelength conversion material may include YAG phosphor, β-SIALON phosphor, fluoride group phosphor (e.g., KSF and MGF group phosphors, etc.), nitride phosphor, and the like. The wavelength conversion member 12 may include one wavelength conversion material, or two or more wavelength conversion materials. Such two or more wavelength conversion materials may include a β-SIALON phosphor which emits green range light and a fluoride group phosphor (e.g., KSF group phosphor, etc.) which emits red range light, for example. These phosphors may provide a wider color reproduction range to the light emitting module 100. In this case, the light emitting element 11 preferably includes a nitride group semiconductor ($In_xAl_yGa_{1-x-y}N$, $0 \le x$, $0 \le y$, $x+y \le 1$) which can emit light in the short wavelength range capable of efficiently exciting the wavelength conversion member 12. In the case in which the light emitting element 11 emitting blue range light is used, for example, the wavelength conversion member 12 may include not smaller than 60%, preferably 90% by weight of KSF group phosphor (red phosphor) so that the light emitting module sufficiently emits red range light. That is, in order to provide particular color light, the wavelength conversion member 12 may include a wavelength conversion material which emits the particular color light. The wavelength conversion material may be quantum dots. The wavelength conversion material may be included in any arrangement in the wavelength conversion member 12. For example, the wavelength conversion material may be substantially uniformly or unevenly distributed. Two or more layers which include different wavelength conversion materials may be laminated on one after another.

Specifically, exemplary composition formulas of such phosphors may be provided by the following general formulas (I), (II), and (III).

$$A_2[M_{1-a}Mn^{4+}{}_aF_6] \tag{I}$$

where A is at least one selected from the group consisting of $K^+$, $Li^+$, $Na^+$, $Rb^+$, $Cs^+$ and $NH^{4+}$, M is at least one element selected from the group consisting of the group 4 element and the group 14 elements, and a satisfies $0<a<0.2$.

where Ma is at least one element selected from the group consisting of Ca, Sr, Ba and Zn, Mb is at least one element selected from the group consisting of Sc, La and Lu, Mc is at least one element selected from the group consisting of Ca, Sr, Ba and Zn, X is at least one element selected from the group consisting of F and Cl, Md is at least one element selected from the group consisting of Ti, Sn and Zr, Me is at least one element selected from the group consisting of B, Al, Ga and In, and x, y, a, b, c, d and e satisfy $2 \le x \le 4$, $0<y \le 2$, $0 \le a \le 1.5$, $0 \le b<1$, $0 \le c \le 2$, $0 \le d \le 0.5$ and $0 \le e<1$, respectively.

$$Ma_xMb_yAl_3N_z:Eu \tag{III}$$

where Ma is at least one element selected from the group consisting of Ca, Sr and Ba, Mb is at least one element selected from the group consisting of Li, Na and K, and x, y and z satisfy $0.5 \le x \le 1.5$, $0.5 \le y \le 1.2$ and $3.5 \le z \le 4.5$, respectively in the above general formula (III).

The KSF phosphor which is represented by the general formula (I) typically has a half-value width within the range not longer than 10 nm. The MGF phosphor which is represented by the general formula (II) typically has a half-value width within the range not shorter than 15 nm and not longer than 35 nm. As represented by the aforementioned general formula (I), in the case of a KSF phosphor having the composition $K_2SiF_6:Mn^{4+}$, Si may be partially substituted by Ti or Ge, which is another tetravalent element, (represented by the composition formula $K_2(Si, Ti, Ge)F_6$:Mn). Also, in the case of a KSF phosphor having the composition $K_2SiF_6:Mn^{4+}$, K may be partially substituted by another alkali metal, or Si may be partially substituted by another trivalent element such as Al. In addition, they may be partially substituted by a plurality of elements.

Light Diffusion Portion 13

The light diffusion portion 13 diffuses and/or reflects light from the light emitting element 11. Accordingly, the light is prevented from concentrating in an area close to the element main-light-emission surface 11c. As a result, luminance unevenness can be prevented. This light diffusion portion 13 is formed of a base material and a light diffusion material which is added into the base material. For example, the light diffusion portion 13 may be formed of the aforementioned base material and inorganic white particles (e.g., $SiO_2$, $TiO_2$, etc.) which are added into the base material. The light diffusion material may be white resin or metal fine particles which are obtained by processing white resin or metal as light-reflection material. The light diffusion material is included at random in the base material. Accordingly, light is repeatedly reflected at random when passing through the light diffusion portion. The passing light will be diffused in many directions. That is, the light is prevented from concentrating in a particular area. As a result, luminance unevenness can be prevented. The light diffusion portion 13 preferably has reflectance of not less than 60%, more preferably not less than 90% of the light from the light emitting element 11.

In the light emitting device 3 shown in FIG. 3, the exterior shape of the light-transmissive member 10 which is constructed of the wavelength conversion member 12 and the light diffusion portion 13 is larger than the exterior shape of the light emitting element 11 as viewed in a plan view. This light emitting device 3 can increase light that passes through the wavelength conversion member 12 and the light diffusion portion 13 from the element main-light-emission surface 11c of the light emitting element 11 and enters the light guide plate 1. Consequently, color unevenness and luminance unevenness can be reduced.

Light-Transmissive Adhesion Member 19

As shown in FIG. 3, the light-transmissive adhesion member 19 covers parts of the element side-surfaces 11e of the light emitting element 11, and a part of the light-transmissive member 10. The exterior side-surface of light-transmissive adhesion member 19 preferably expands from the element side-surface 11e of the light emitting element 11 toward the light-transmissive member 10 as viewed in a cross-sectional view. In other words, the light-transmissive adhesion member 19 preferably has an inclined exterior side-surface. The light-transmissive adhesion member 19 more preferably has a concave exterior side-surface. That is, the exterior side-surface of the light-transmissive adhesion member 19 has a convex downward curve as viewed in a cross-sectional view. This light-transmissive adhesion member can more effectively direct light that exits through the element side-surfaces 11e of the light emitting element 11 toward the light-transmissive member 10. As a result, the light extracting efficiency can be increased.

The light-transmissive adhesion member 19 may be also arranged between the element main-light-emission surface 11c of the light emitting element 11 and the light-transmissive member 10. In this arrangement, for example, in the case in which the light-transmissive adhesion member 19 includes a light diffusion material, light that exits through the element main-light-emission surface 11c of the light emitting element 11 is diffused in the light-transmissive adhesion member 19 and enters the light-transmissive member 10. As a result, luminance unevenness can be reduced. The light-transmissive adhesion member 19 can be formed of the same material as an interposition member 14 discussed later.

First Light-Reflection Member 15

The element side-surfaces 11e of the light emitting element 11 are covered by the first light-reflection member 15 in the light emitting device 3 after the light-transmissive member 10 is fixed onto the light emitting element 11. More specifically, the first light-reflection member 15 covers parts of the element side-surfaces 11e of the light emitting element 11 and the exterior side-surface of the light-transmissive adhesion member 19 which are not covered by the light-transmissive adhesion member 19.

The first light-reflection member 15 may be formed of a white resin having a good reflectivity. The white resin preferably includes a light-transmissive resin and white powder or the like as additive for reflecting light. Because the first light-reflection member 15 covers the surfaces other than the element main-light-emission surface 11c of the light emitting element 11, leakage of light in the directions other than toward the element main-light-emission surface 11c can be suppressed in the light emitting device 3. That is, the first light-reflection member 15 reflects light that exits through the element side-surfaces 11e and the element electrode-formation surface 11d of the light emitting element 11 so that light emitted by the light emitting element 11 can be effectively emitted outward through the light-guide first main-surface 1c of the light guide plate 1. Consequently, the light extracting efficiency of the light emitting module 100 can be increased.

The first light-reflection member 15 may be formed of a first resin as base material and a light-reflection material which is distributed in the first resin. Exemplary resin materials of the first resin include light-transmissive materials such as phenyl group resin, epoxy resin, silicone resin, mixed resin of these resins, glass, and the like. Preferably, a hard hybrid resin (two-part silicone epoxy resin) is used. In this case, after this resin is cured, its hardness can be high. Accordingly, this resin can provide effects such as improvement of dimensional accuracy of the product. In particular, in the case in which the base material of the first light-reflection member 15 is the same resin as the second light-reflection member 16 and the interposition member 14, they can be bonded well. For this reason, it is possible to suppress causes of peel damage which may occur when stresses are applied to the bonding interface between them such as resin sink in curing, deformation in thermal expansion, and the like. White pigments, in particular, $TiO_2$ and other materials which have good reflectivity can be used for the light-reflection material.

Suitable materials for the first light-reflection member 15 are white resins which have a reflectance of not less than 60%, preferably not less than 90% of the light emitted by the light emitting element 11. In addition, a first filler for adjusting viscosity can be mixed. The first filler is preferably formed of an inorganic substance which is obtained from metal. The density of the first filler preferably falls within the range 1 to 10%, more preferably smaller than 5% of the resin material. Also, the hardness of the first light-reflection member 15 can be adjusted by the density of the first filler. The first light-reflection member 15 preferably has a hardness within Shore A hardness 30 to Shore D hardness 100. In this embodiment, a hard hybrid resin (two-part silicone epoxy resin) and $TiO_2$ may be used as the first resin and the first filler, respectively.

The first light-reflection member 15 at least partially contacts the element side-surfaces 11e of the light emitting elements 11 and is arranged around the light emitting elements 11 so that the light emitting elements 11 are embedded in the first light-reflection member 15 but the element electrodes 11b of the light emitting elements 11 are exposed from the surface of the first light-reflection member 15. The first light-reflection member 15 contacts the light-transmissive member 10. The exterior side-surface of the first light-reflection member 15 is coplanar with the exterior side-surface of the light-transmissive member 10. The first light-reflection member 15 is integrally constructed of the light emitting element 11 and the light-transmissive member 10 in the light emitting device 3. The light guide plate 1 holds the light emitting devices 3.

Light Guide Plate 1

The light guide plate 1 is a light-transmissive member for emitting light from the light sources uniformly in the plane parallel to the screen. The light guide plate 1 has the light-guide first main-surface 1c as the light emitting surface, and the light-guide second main surface 1d which is opposed to the light-guide first main surface 1c as shown in FIG. 3. The light guide plate 1 has the recessed parts 1b which are formed in the light-guide second main-surface 1d. In this embodiment, grooves 1e are formed between the recessed parts 1b adjacent to each other.

The light emitting device 3 is partially accommodated in the recessed part 1b. More specifically, the light-transmissive member 10 as a part of light emitting device 3 is opposed to the bottom surface of the recessed part 1b, and is accommodated in the recessed part 1b of the light guide plate 1. This arrangement can reduce the entire thickness of the light emitting module. As shown in FIGS. 2 and 3, the light emitting module 100 has the recessed parts 1b which are formed in the light guide plate 1 so that the light emitting devices 3 are partially accommodated in their corresponding recessed part 1b.

Figure 4:
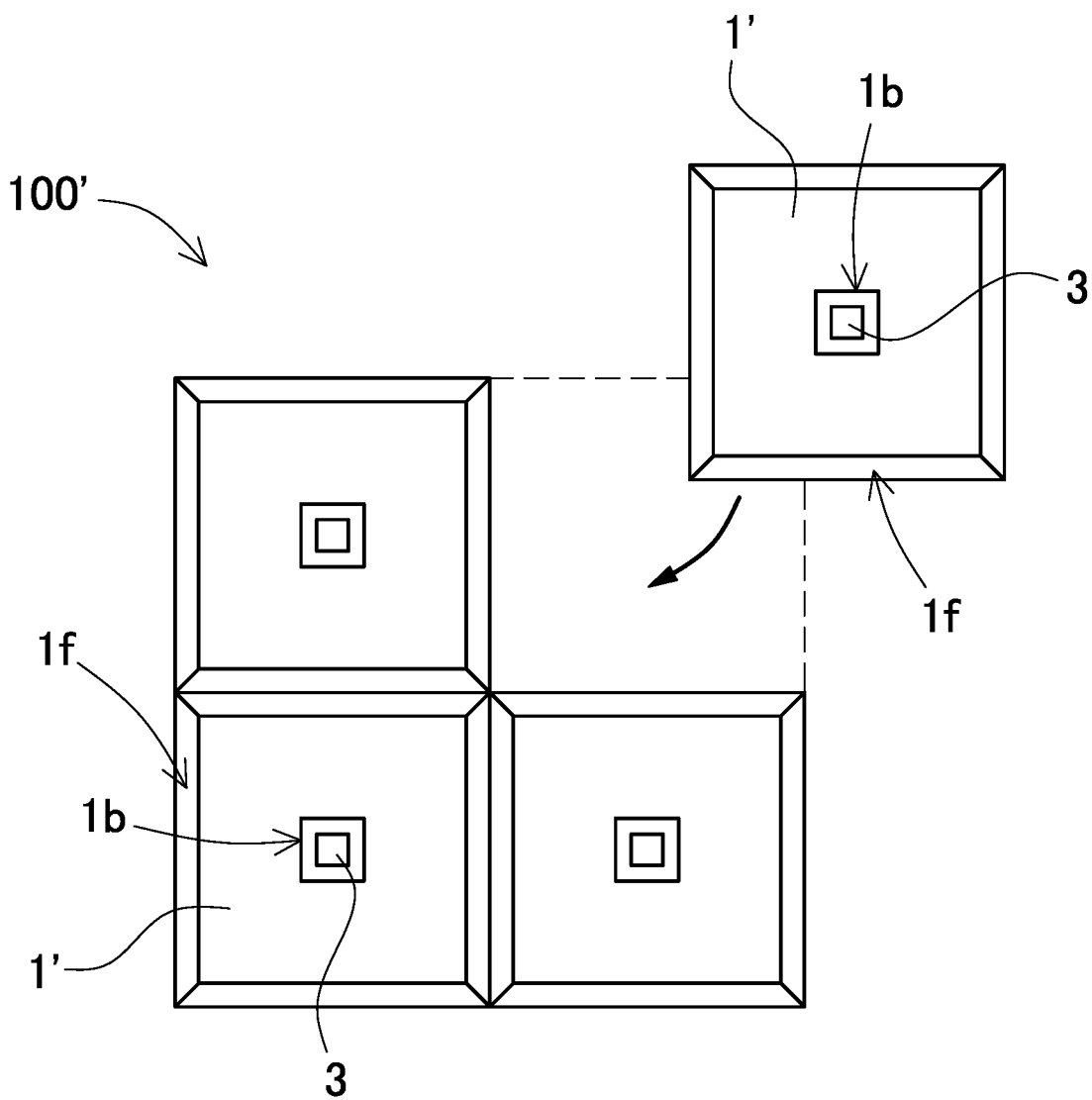
FIG. 4 is a schematic bottom view of a light emitting module according to a modified embodiment of the present disclosure.

Alternatively, as shown in FIG. 4, the light emitting module 100' can include the light guide plates 1' each of which has one recessed part 1b and holds a part of one light emitting device 3 in the one recessed part 1b. The light guide plates 1' are arranged in a matrix shape. The grooves 1e are formed between the recessed parts 1b in a grid shape on the light guide plate 1 which has the recessed parts 1b as shown in FIG. 3. The light guide plate 1' which has one recessed part 1b has inclined surfaces 1f on all the peripheral sides of the light-guide second main-surface 1d as shown in FIG. 4. The inclined surfaces 1f are inclined toward the edges of the light guide plate 1'.

The second light-reflection member 16 is formed on the surfaces of the grooves 1e or inclined surfaces 1f. The second light-reflection member 16 which is formed in the grooves 1e is preferably formed of a white resin which reflects light as discussed in more detail later. The white resin prevents light of the light emitting element 11 that travels in one part of the light guide plate 1 from entering a neighboring part that is separated from the one part by the groove 1e. That is, leakage of light from one light emitting element 11 can be prevented from one part of the light guide plate 1 to another part. The second light-reflection member 16 which covers the inclined surfaces 1f located on the peripheral sides of the light-guide second main-surface 1d prevents leakage of light from one light guide plate 1' to another light guide plate 1'. As a result, intensity reduction of light emitted from the light-guide first main surface 1c of the light guide plate 1' can be prevented.

The size of the light guide plate 1 can be suitably dimensioned depending on the size of the liquid crystal display 1000. For example, in the case of the light guide plate 1 which has a number of recessed parts 1b, one side can be from approximately 1 to 200 cm, preferably from approximately 3 to 30 cm. The thickness of the light guide plate can be from approximately 0.1 to 5 mm, preferably from approximately 0.1 to 3 mm. The light guide plate 1 may have a roughly rectangular or circular shape as viewed in a plan view, for example.

Exemplary materials of the light guide plate 1 can be provided by optically transparent materials including resin materials, such as thermoplastic resins (e.g., acrylic resin, polycarbonate, cyclic polyolefin, polyethylene terephthalate and polyester resin) and thermosetting resins (e.g., epoxy resin and silicone), glass, and the like. In particular, thermoplastic resin materials can be preferably used, because the light guide plate can be efficiently produced from such thermoplastic resin materials. Among them, polycarbonate is preferably used, because it has high transparency and is inexpensive. Even a low heat-resistant thermoplastic material such as polycarbonate can be used for the light emitting module which is produced without subjected to a high-temperature environment (e.g., reflow soldering) in the production processes.

The light guide plate 1 can be formed of a single light-transmissive layer or a plurality of light-transmissive layers. In the case in which the light guide plate is formed of a plurality of light-transmissive layers, a different refractive index layer such as air layer is preferably formed between any two layers. This arrangement enhances diffusion of light. As a result, the light emitting module can have reduced luminance unevenness. This arrangement may be provided by arranging a spacer between any two light-transmissive layers whereby forming space between them to form a layer of air, for example. Also, a light-transmissive layer may be arranged above the light-guide first main surface 1c of the light guide plate 1 so that a different refractive index layer such as air layer is formed between the light-guide first main surface 1c of the light guide plate 1 and this light-transmissive layer. This arrangement enhances diffusion of light. As a result, the liquid crystal display can have reduced luminance unevenness. This arrangement may be provided by arranging a spacer between the light guide plate 1 and the light-transmissive layer whereby forming space between them to form a layer of air, for example.

Recessed Part 1b

The light guide plate 1 has the recessed parts 1b which are formed on the light-guide second main-surface 1d side. A part of the light emitting device 3 is accommodated in the recessed part 1b so that the light-transmissive member 10 faces the bottom surface of the recessed part 1b. The interior side-surface of the recessed part 1b is larger than the exterior side-surface of the light emitting device 3 as viewed in a plan view. More specifically, as shown in FIG. 3, the interior side-surfaces of the recessed part 1b are located outside the exterior side-surfaces of the light emitting device 3.

As viewed in a plan view, the interior shape of the recessed part 1b of the light guide plate 1 and 1' shown in FIGS. 2 to 4 is designed rectangular. Correspondingly, the exterior shape of the light emitting device 3 to be accommodated in the recessed part is designed rectangular. When the rectangular light emitting device 3 is accommodated in the rectangular recessed part 1b, the exterior side-surfaces of the light emitting device 3 can be arranged parallel to the interior side-surfaces of the recessed part 1b, in other words, be opposed to the interior side-surfaces of the recessed part 1b. On the other hand, it is more preferable that the rectangular light emitting device 3 is arranged with a 45-degree slant, that is, its exterior side-surfaces are inclined 45° relative to the interior side-surfaces of the recessed part 1b as shown in FIG. 4. In addition, the center of the light emitting device 3 preferably substantially agrees with the center of the bottom surface of the recessed part 1b as viewed in a plan view. According to this arrangement, the distance between the side surface of the light emitting device 3 and the interior side-surface of the recessed part 1b can be constant. As a result, the color unevenness of the light emitting module can be improved. On the other hand, the light emitting device which has a rectangular exterior shape may be arranged so that its sides intersect the rectangular recessed part, in other words, the rectangular light emitting device is arranged at a slant with respect to the rectangular recessed part.

Although the size of the recessed part 1b can be modified depending on the exterior shape of the light emitting device 3 in a plan view, when the recessed part 1b has a circular, ellipse, or rectangular shape, for example, its diameter, major axis, or diagonal length can be dimensioned 0.05 to 10 mm, preferably 0.1 to 2 mm. The depth of the recessed part can be dimensioned 0.05 to 4 mm, preferably from 0.1 to 1 mm. The shape of the recessed part 1b in a plan view can be suitably selected depending on the pitch between the recessed parts 1b or the like, and can be designed substantially rectangular or circular, for example. When the pitches between the recessed parts 1b (distance between the centers of two recessed parts 1b closest to each other) are substantially equal, the recessed parts 1b preferably have a substantially circular or square shape. In particular, substantially circular recessed parts can effectively spread light from the light emitting device 3.

The depth of the recessed part 1b from the bottom surface of the recessed part 1b to the light-guide second main-surface 1d is preferably dimensioned so that the element main-light-emission surface 11c is substantially coplanar with the light-guide second main-surface 1d of the light emitting element 11 as viewed in a cross-sectional view as shown in FIG. 3. Also, the depth of the recessed part 1b may be dimensioned so that the upper surface of the light emitting element 11 is positioned higher than the light-guide second main-surface 1d when the light emitting element 11 is mounted in the recessed part 1b. According to this arrangement, the light emitting element 11 protrudes from the recessed part 1*b*. Accordingly, the element electrodes 11*b* can easily be wired. As discussed above, the depth of the recessed part 1*b* is preferably adjusted in accordance with the height of the light emitting element 11.

The light guide plate 1 has one or more recessed parts 1*b* which accommodate the light emitting device 3 and the interposition member 14. As shown in FIG. 3 or the like, two or more recessed parts 1*b* are preferably formed in the light guide plate 1. The light emitting device 3 and the interposition member 14 are accommodated in their corresponding recessed part 1*b*. An interface between the interposition member 14 and the second light-reflection member 16 may be inclined as viewed in a vertical cross-sectional view.

Interposition Member 14

The light-transmissive interposition member 14 contacts the interior side-surfaces of the recessed part 1*b* and the exterior side-surfaces of the light emitting device 3. Also, the interposition member 14 contacts a part of the first light-reflection member 15 which is located outside the recessed part 1*b*, in other words, the interposition member 14 covers the area which extends from the exterior side-surfaces of the light-transmissive member 10 to the exterior side-surfaces of the first light-reflection member 15. The exterior side-surface of the interposition member 14 is an inclined surface 14*a*. The inclination angle α of the inclined surface 14*a* with respect to the exterior side-surface of the first light-reflection member 15 is an acute angle. In addition, the interposition member 14 can be arranged between the light-transmissive member 10 and the bottom surface of the recessed part 1*b*.

As shown in FIG. 3, the interposition member 14 also contacts the light-guide second main-surface 1*d* of the light guide plate 1. According to this arrangement, the inclined surface 14*a* can be formed wider, and can more effectively reflect light. Therefore, luminance unevenness can be reduced. The inclination angle α which the inclined surface 14*a* of the interposition member 14 forms with the exterior side-surface of the first light-reflection member 15 can be 5° to 85°, preferably 5° to 50°, more preferably 10° to 45°. The inclination angle α is specified depending on the width between the exterior side-surface of the light emitting device 3 and the interior side-surface of the recessed part 1*b* so that the interposition member 14 spreads in a skirt shape so as to contact the light-guide second main-surface 1*d* of the light guide plate 1, in other words, the exterior side-surfaces of the light emitting device 3 are covered by the interposition member 14 and the recessed part 1*b* is filled up with the interposition member 14. The width between the exterior side-surface of the light emitting device 3 and the interior side-surface of the recessed part 1*b* can be modified depending on the inner diameter of the recessed part 1*b*, the outer diameter of the light emitting device 3, their shapes, the orientation of the light emitting device 3 when the light emitting device 3 is accommodated in the recessed part 1*b*, the tolerance of the mount position of the light emitting device 3, and the like. In addition, whether the skirt-shaped interposition member 14 contacts the light-guide second main-surface 1*d* of the light guide plate 1 depends on the height of the interposition member 14 (i.e., the height of the light emitting device 3), the thickness of the light-transmissive member 10, and the depth (height) of the recessed part 1*b*. For these reasons, the inclination angle α is specified depending on these factors so that the skirt-shaped interposition member 14 can contact the light-guide second main-surface 1*d* of the light guide plate 1.

As shown in FIG. 3, the interposition member 14 has the inclined surface 14*a* as viewed in a cross-sectional view. This shape can uniformly reflect light incident on the inclined surface 14*a* that passes through the interposition member 14 toward the light emission surface.

Exemplary materials of the interposition member 14 may include light-transmissive thermosetting resin materials such as epoxy resin, silicone resin, and the like. The interposition member 14 has transmittance not smaller than 60%, preferably not smaller than 90%. Although the interposition member 14 can include a light diffusion material or the like, or white powder or the like as additives for reflecting light, the interposition member may be formed of only the light-transmissive resin material which includes neither such a light diffusion material nor white powder. In addition, a third filler for adjusting viscosity may be mixed. The third filler is preferably formed of an inorganic substance which is obtained from metal, and preferably has transparency. The third filler in the interposition member 14 preferably has a density lower than the second filler in the second light-reflection member 16. The density of the third filler preferably falls within the range 0 to 10%, more preferably smaller than 5% of the resin material. The interposition member 14 preferably has a hardness within Shore A hardness 30 to Shore D hardness 80.

The interposition member 14 is formed of a third resin as base material and a light-transmissive material which is distributed in the third resin. Exemplary resin materials of the third resin may include light-transmissive materials such as phenyl group resin, epoxy resin, silicone resin, mixed resin of these resins, glass, and the like. In particular, silicone resin is preferably used. In this case, because the interposition member 14 has a relatively low hardness as compared with the first and second light-reflection members 15 and 16, it can have deformability. In particular, in the case in which the base material of the interposition member 14 is the same resin as the first and second light-reflection members 15 and 16, they can be bonded well. For this reason, it is possible to suppress causes of peel damage which may occur when stresses are applied to the bonding interface between them such as resin sink in curing, deformation in thermal expansion, and the like. $SiO_2$ and ceramics (e.g., alumina, etc.) can be used as the light-transmissive material.

Second Light-Reflection Member 16

The second light-reflection member 16 has a second light-reflecting connection surface that faces the light-guide second main-surface 1*d* of the light guide plate 1, and a second light reflection main-surface that is opposed to the connection surface. The second light-reflection member 16 covers the light-guide second main-surface 1*d* of the light guide plate 1 and the light emitting device 3, as shown in FIG. 3. More specifically, the second light-reflection member 16 covers the light-guide second main-surface 1*d* of the light guide plate 1, the inclined surface 14*a* of the light-transmissive interposition member 14, and parts of the exterior side-surfaces of the first light-reflection member 15 that are not covered by the interposition member 14.

The second light-reflection member 16 reflects light that is emitted by the light emitting element 11 and light that enters the light guide plate 1 whereby guiding the light toward the light-guide first main-surface 1*c* which serves as the light emission surface through which light exits. As a result, the light extracting efficiency can be improved. Also, the second light-reflection member 16 which is laminated on the light guide plate 1 reinforces the light guide plate 1. The second light-reflection member 16 serves both as a member for protecting the light emitting element 11, and a layer for reflecting light at the interface between the second light-reflection member 16 and the light-guide second main surface 1d of the light guide plate 1. Therefore, the light emitting module 100 can be thin.

The second light-reflection member 16 can be suitably formed of the same material as the first light-reflection member 15, that is, a white resin which includes a light-transmissive resin and white powder or the like as additive for reflecting light. The second light-reflection member 16 effectively directs light from the light emitting elements 11 toward the light guide plate 1 so that the light is emitted outward through the light-guide first main surface 1c.

The second light-reflection member 16 is formed of a second resin as base material and a light-reflection material which is distributed in the second resin. Exemplary resin materials of the second resin may include light-transmissive materials such as phenyl group resin, epoxy resin, silicone resin, mixed resin of these resins, glass, and the like. Preferably, a hard hybrid resin (two-part silicone epoxy resin) is used. In this case, after this resin is cured, its hardness can be high. Accordingly, this resin can provide effects such as improvement of dimensional accuracy of the product. In particular, in the case in which the base material of the second light-reflection member 16 is the same resin as the first light-reflection member 15 and the interposition member 14, they can be bonded well. For this reason, it is possible to suppress causes of peel damage which may occur when stresses are applied to the bonding interface between them such as resin sink in curing, deformation in thermal expansion, and the like. White pigments, in particular, $TiO_2$ and other materials which have good reflectivity can be used for the light-reflection material.

Similar to the first light-reflection member 15, suitable materials for the second light-reflection member 16 are white resins which have a reflectance of not less than 60%, preferably not less than 90% of the light emitted by the light emitting element 11. According to this sealing resin portion, inexpensive raw materials including titanium oxide are used as a relatively large amount of material to entirely cover the surface of the light guide plate 1. Therefore, the light emitting module 100 can be inexpensively formed. In addition, a second filler for adjusting viscosity can be mixed. An inorganic substance which is obtained from metal can be suitably used as the second filler. The density of the second filler preferably falls within the range 1 to 10%, more preferably smaller than 5% of the resin material. The second light-reflection member 16 preferably has a hardness within Shore A hardness 30 to Shore D hardness 100.

Interposition Structure of Interposition Member 14

In the aforementioned arrangement, the interposition member 14 at least partially separates the first and second light-reflection members 15 and 16 from each other as viewed in a plan view from the light-guide second main-surface 1d side. In the separated area, the interposition member 14 is exposed from the second light-reflection member 16. In other words, the interposition member 14 is interposed between the first and second light-reflection members 15 and 16. The hardness of the interposition member 14 is specified lower than both the first and second light-reflection members 15 and 16. As discussed above, the first light-reflection member 15 does not directly contact the second light-reflection member 16, and the relatively low-hardness interposition member 14 is interposed between the first and second light-reflection members 15 and 16. Accordingly, the relatively high-hardness first and second light-reflection members 15 and 16 can be prevented from rubbing against each other even in expansion/contraction when these members are heated. As a result, dust generation can be suppressed.

In the case in which the first light-reflection member directly contacts the second light-reflection member, if the first and second light-reflection members are formed of a relatively high-hardness resin, the first and second light-reflection members of such a hard resin expand when heated and contract when their temperature drops so that friction will be produced at the interface between the first and second light-reflection members by thermal oscillation. Because white particles of inorganic substance are mixed into the organic compound resin of the first and second light-reflection members, the inorganic particles will rub against each other and sharply generate heat when the first and second light-reflection members thermally expand/contract at their interface. In particular, the first light-reflection member covers the periphery of the light emitting element in intimate contact. For this reason, when the light emitting element is turned on, heat is generated and directly conducted to the resin of the first light-reflection member. As a result, the temperature of the first light-reflection member will be high, and such thermal oscillation will be significant. Improvement of the adhesive strength between the first and second light-reflection members of resin cannot be attained at the interface where such significant thermal oscillation occurs because the light emitting element is very small (approximately 1 mm). That is, it is difficult for resin materials to provide sufficient adhesive strength to withstand such significant thermal oscillation. To address this, in this embodiment, as discussed above, the first light-reflection member 15 is not directly fixed onto the second light-reflection member 16 but the interposition member 14 which has a hardiness lower than them is interposed between them so that the influence of such thermal oscillation can be reduced. In particular, the relatively low-hardness interposition member 14 can have a cushioning effect for absorbing deformation. Accordingly, crack generation can be suppressed. As a result, the durability can be increased. Therefore, the reliability can be improved.

Figure 5:
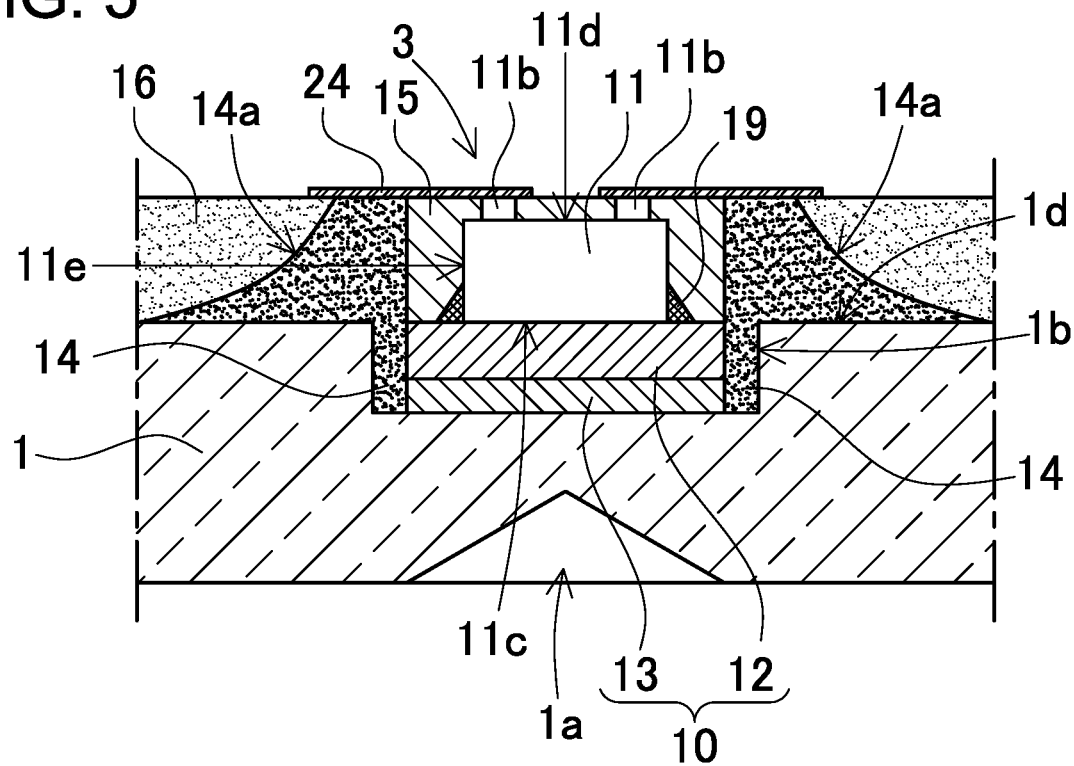
FIG. 5 is an enlarged cross-sectional view schematically showing the light emitting module according to the first embodiment of the present disclosure.

As shown in a schematic cross-sectional view of FIG. 5, the interface between the interposition member 14 and the second light-reflection member 16 on the second light reflection main-surface is located outside the end surface of the light-transmissive member 10 as viewed in a vertical cross-sectional view. This arrangement can improve the aforementioned cushioning effect.

The interface between the interposition member 14 and the second light-reflection member 16 on the second light reflection main-surface is more preferably located outside the end surface of the recessed part 1c as viewed in a vertical cross-sectional view. This arrangement can further improve the aforementioned cushioning effect.

Modified Embodiment of Inclined Surface 14a

The inclined surface 14a of the light-transmissive interposition member 14 can be curved as viewed in a cross-sectional view. In the interposition member 14 shown in FIG. 5, the inclined surface 14a is a concave surface (a convex downward curve as viewed in a cross-sectional view), in other words, its curve protrudes toward the recessed part 1b in a cross-sectional view. This inclined surface 14a can provide a wider directional traveling range of light that is reflected by the inclined surface 14a.

Second Embodiment

Figure 6:
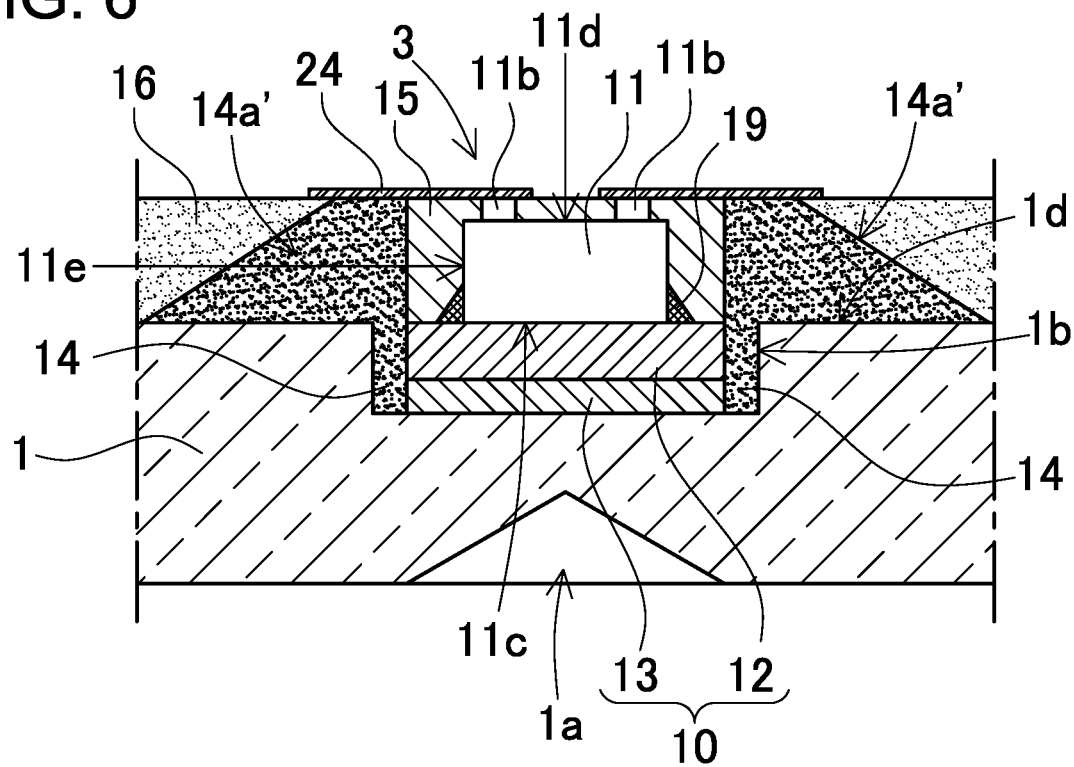
FIG. 6 is an enlarged cross-sectional view schematically showing a light emitting module according to a second embodiment of the present disclosure.

The inclined surface of the interposition member can have a straight line as viewed in a cross-sectional view. This type of light emitting module according to a second embodiment is shown in a schematic cross-sectional view of FIG. 6. The components according to this illustrated light emitting module similar to the foregoing first embodiment are attached with the same reference signs as the first embodiment, and their description is omitted. Because an inclined surface 14a' which serves as the interface between the interposition member 14 and the second light-reflection member 16 is formed in a flat shape, the flat parts of the interposition member 14 and the second light-reflection member 16 which are fixed onto each other can be large. Therefore, effects such as adhesive strength improvement can be obtained.

Third Embodiment

Figure 7:
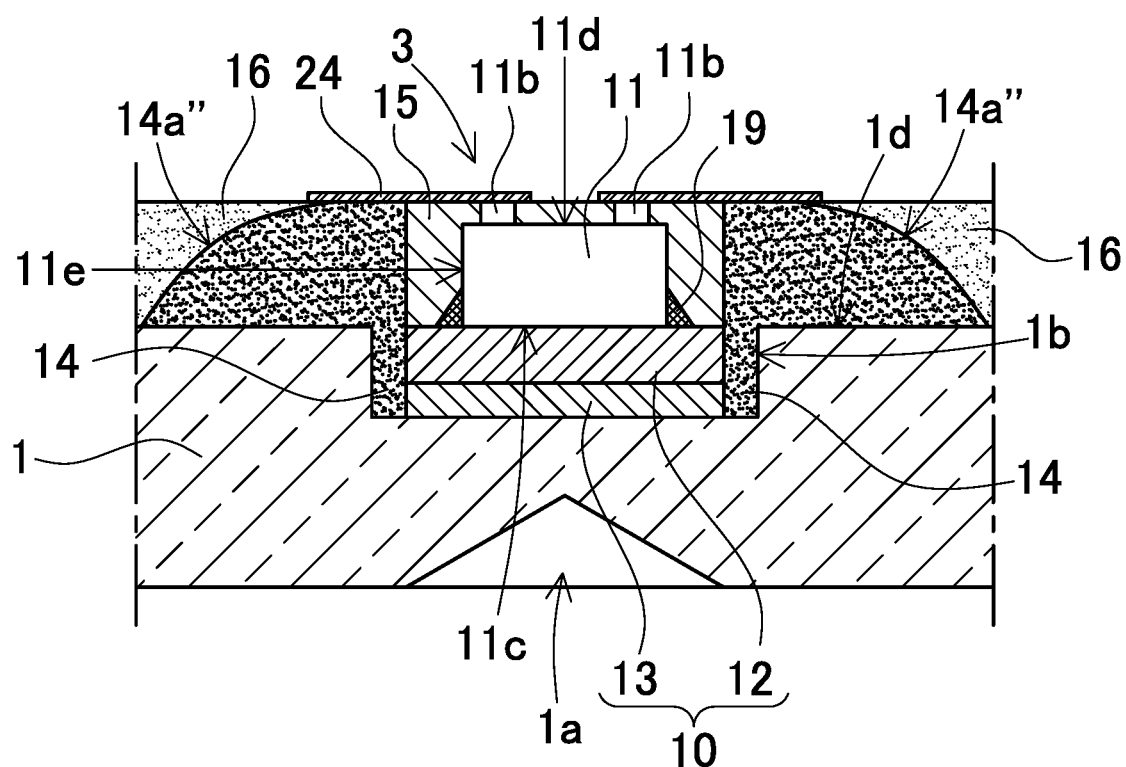
FIG. 7 is an enlarged cross-sectional view schematically showing a light emitting module according to a third embodiment of the present disclosure.

The inclined surface of the interposition member can be also a convex surface (a convex upward curve as viewed in a cross-sectional view), in other words, its curve protrudes toward the second light-reflection member 16 in a cross-sectional view. This type of light emitting module according to a third embodiment is shown in a schematic cross-sectional view of FIG. 7. The components according to this illustrated light emitting module similar to the foregoing first embodiment or the like are also attached with the same reference signs as the first embodiment, and their description is omitted. In this embodiment, a larger amount of resin is applied for an inclined surface 14a" of the interposition member 14 so that the inclined surface 14a" bulges. As a result, the inclined surfaces 14a" can be formed in a convex lens shape. This shape can provide an effect of promoting light propagation in the lateral directions of the light guide plate 1.

Figure 8:
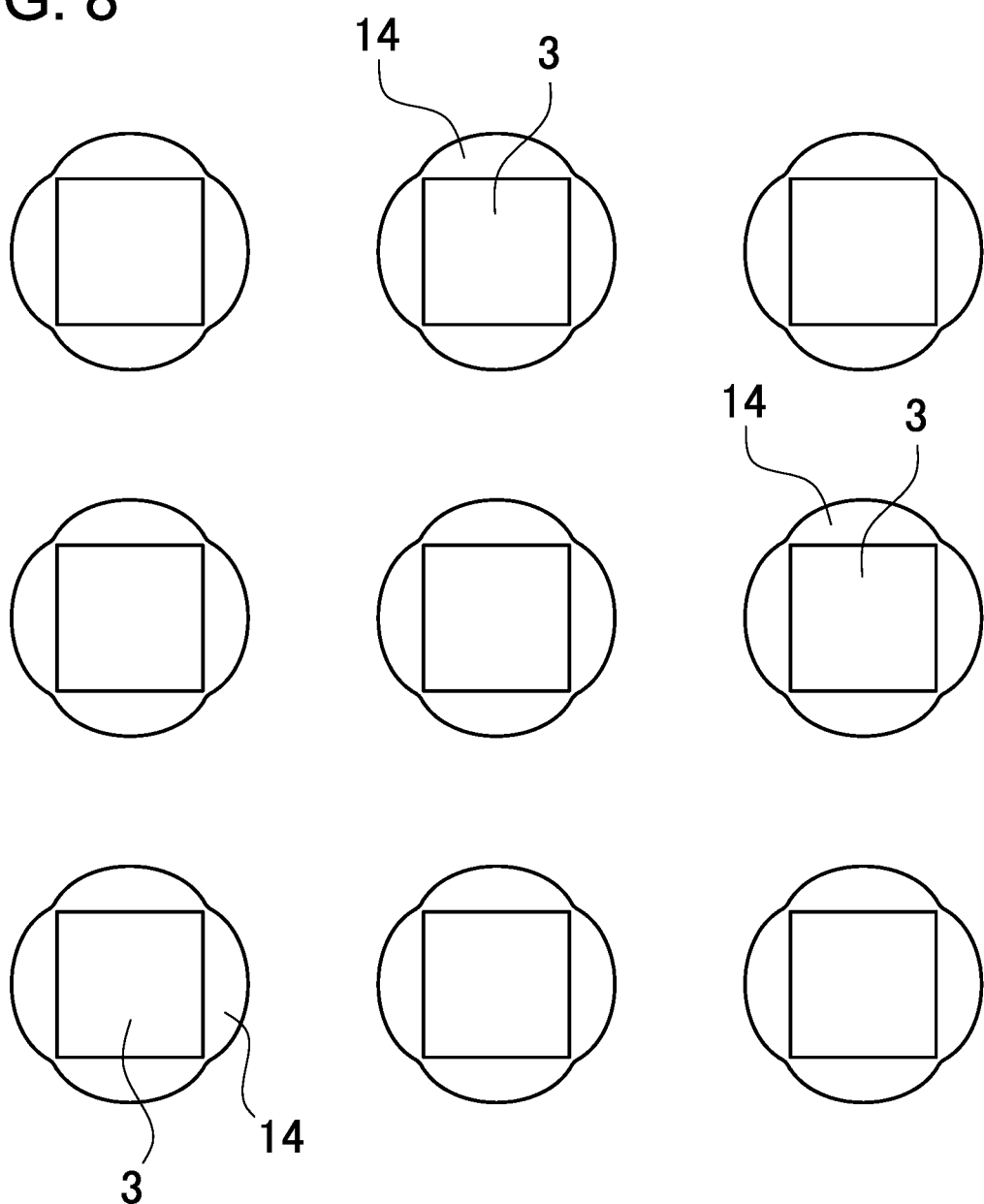
FIG. 8 is a schematic plan view showing the light emitting module according to the first embodiment of the present disclosure.

Here, it is noted that, as shown in a plan view of FIG. 8, the width of the interposition member 14 of the light emitting device 3 according to the first embodiment is smaller at the ends of a side of the rectangular light emitting device 3 than in the central part of this side, which is located between these ends, as viewed in a plan view. According to this arrangement, a larger volume of the interposition member 14 resin is arranged in the central part of the side in which relatively larger deformation caused by expansion/contraction appears as compared to the corner parts. As a result, the deformation absorption effect can be improved. Therefore, the interface between the first and second light-reflection members 15 and 16 can be protected.

Fourth Embodiment

Figure 9:
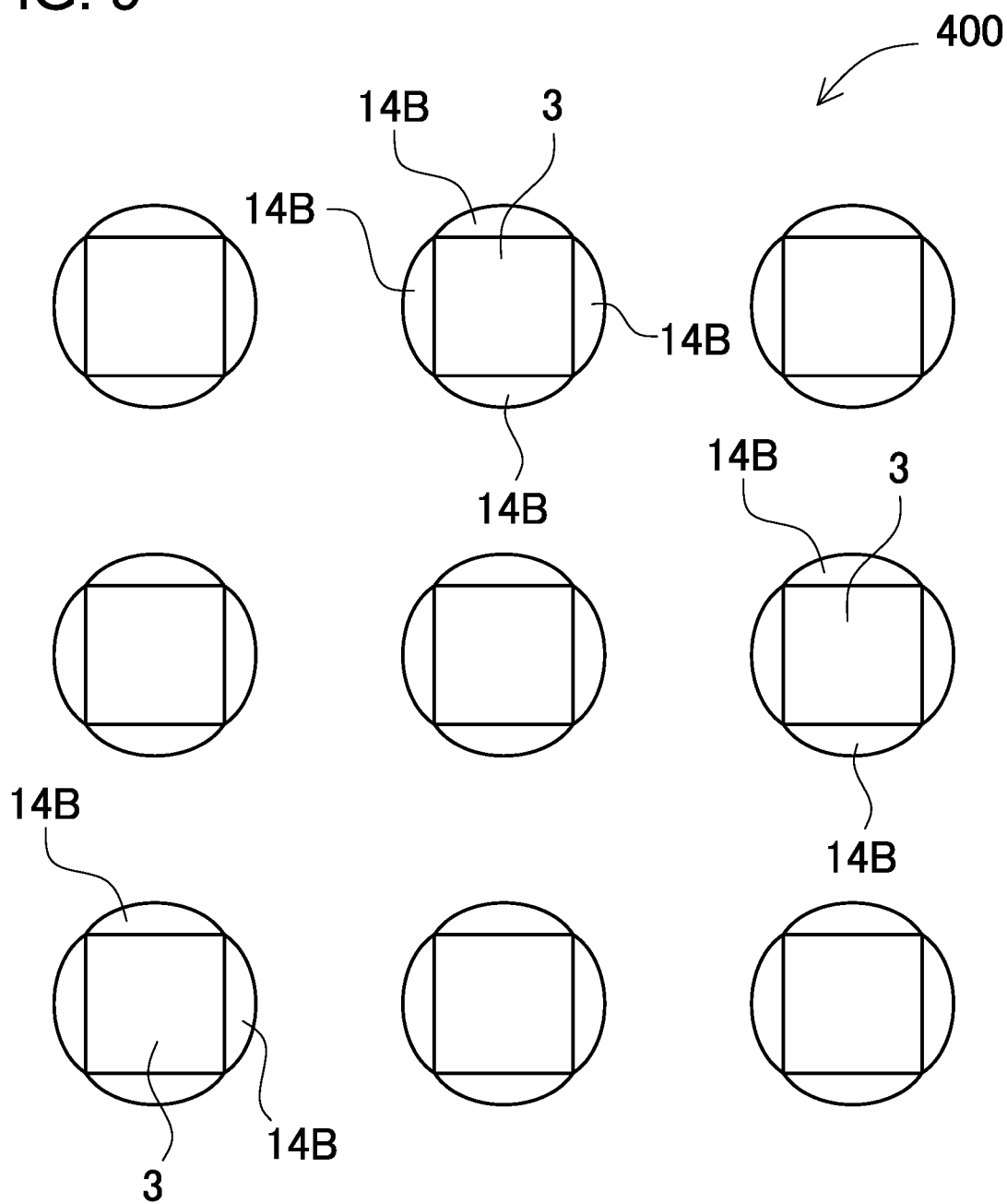
FIG. 9 is a schematic plan view showing a light emitting module according to a fourth embodiment of the present disclosure.

In the corner parts of the light emitting device, it can be considered that the amount of deformation caused by expansion/contraction is small. From this viewpoint, the interposition member may be omitted in the corner parts, in other words, the interposition member may not be interposed between the first and second light-reflection members in the corner parts. This type of light emitting module 400 according to a fourth embodiment is shown in a plan view of FIG. 9. The components according to this illustrated light emitting module similar to the foregoing first embodiment or the like are also attached with the same reference signs as the first embodiment, and their description is omitted. Also, in this embodiment, because the interposition member 14 is arranged in the central parts of each side of the rectangular light emitting device, the deformation absorption effect can be improved. Therefore, the interface between the first and second light-reflection members 15 and 16 can be protected. According to this arrangement, an interposition member 14B is arranged only in the required parts. As a result, the limited interposition member 14B can provide an effect of suppressing light leakage from this interposition member 14B.

Fifth Embodiment

Figure 10:
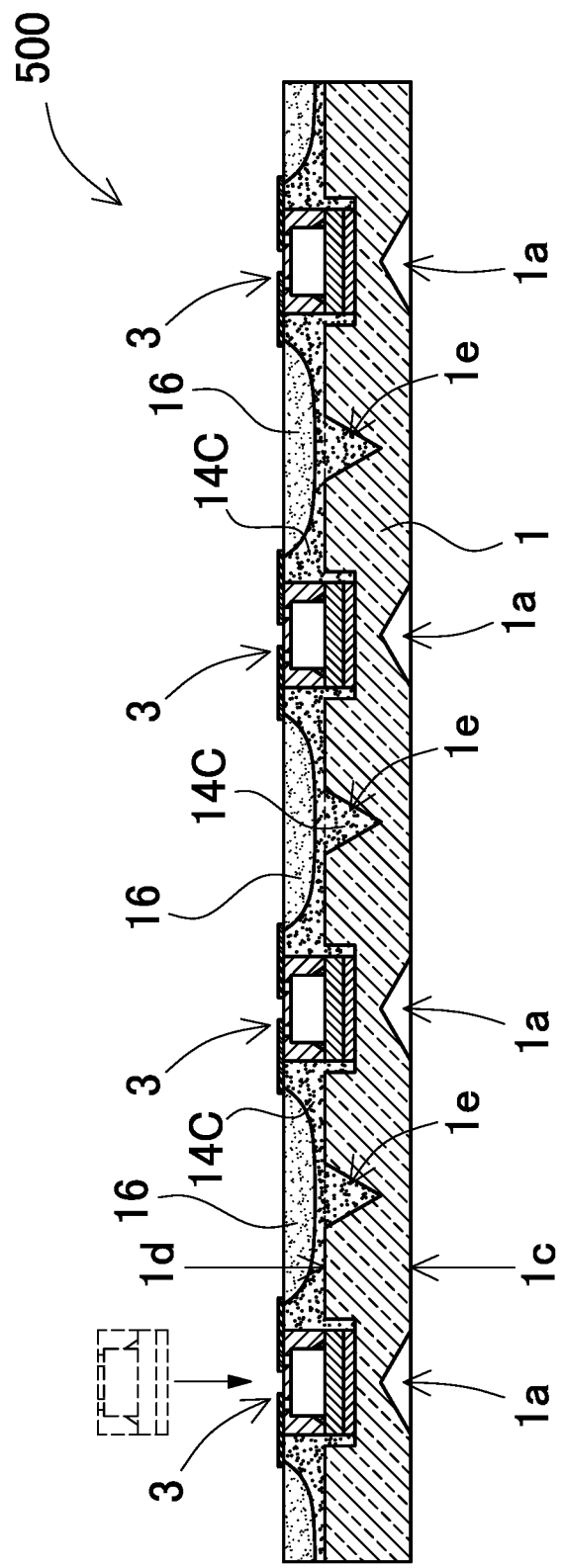
FIG. 10 is a schematic cross-sectional view showing a light emitting module according to a fifth embodiment of the present disclosure.

The second light-reflection member 16 has been illustratively described to be accommodated in the grooves 1e which are formed in the light guide plate 1 in the first embodiment shown in FIG. 3. However, the present disclosure is not limited to this arrangement. For example, instead of the second light-reflection member, the interposition member may be accommodated in the grooves of the light guide plate 1. This type of light emitting module 500 according to a fifth embodiment is shown in a schematic cross-sectional view of FIG. 10. The components according to this illustrated light emitting module similar to the foregoing first embodiment or the like are also attached with the same reference signs as the first embodiment, and their description is omitted. The V-shaped grooves 1e which are formed in the light guide plate 1 are filled up with the interposition member 14C. The hardness of the interposition member 14C is lower than the light guide plate 1. According to this arrangement, because a relatively low-hardness interposition member 14C is interposed also in the interface between the second light-reflection member 16 and the light guide plate 1, deformation or crack caused by thermal expansion and contraction can be prevented.

Sixth Embodiment

Figure 11:
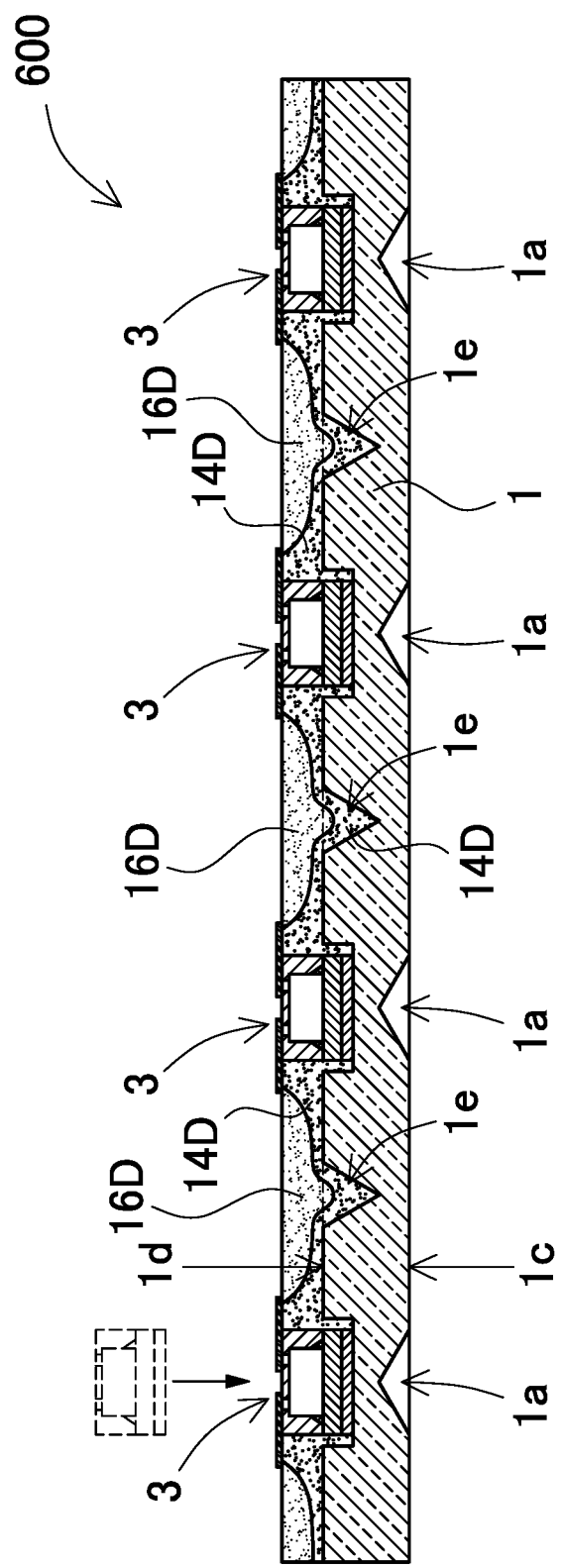
FIG. 11 is a schematic cross-sectional view showing a light emitting module according to a sixth embodiment of the present disclosure.

Also, the groove may be not completely embedded with the interposition member but the second light-reflection member may be partially accommodated in the groove. This type of light emitting module 600 according to a sixth embodiment is shown in a schematic cross-sectional view of FIG. 11. The components according to this illustrated light emitting module similar to the foregoing first embodiment or the like are also attached with the same reference signs as the first embodiment, and their description is omitted. The V-shaped groove 1e which is formed in the light guide plate 1 is partially filled with an interposition member 14D, and the remaining part of the groove 1e is filled up with a second light-reflection member 16D in FIG. 11. Also in this arrangement, the interposition member 14D can protect the interface between the second light-reflection member 16D and the light guide plate 1 from thermal oscillation similar to the fifth embodiment. In addition, the second light-reflection member 16D which is partially accommodated in the groove 1e can prevent light that is emitted by the light emitting element 11 in one area defined by the grooves 1e entering another area defined by the grooves 1e. As a result, ON/OFF of light emission of one light emitting element 11 can be surely independently controlled from the other light emitting elements 11.

Seventh Embodiment

Figure 12:
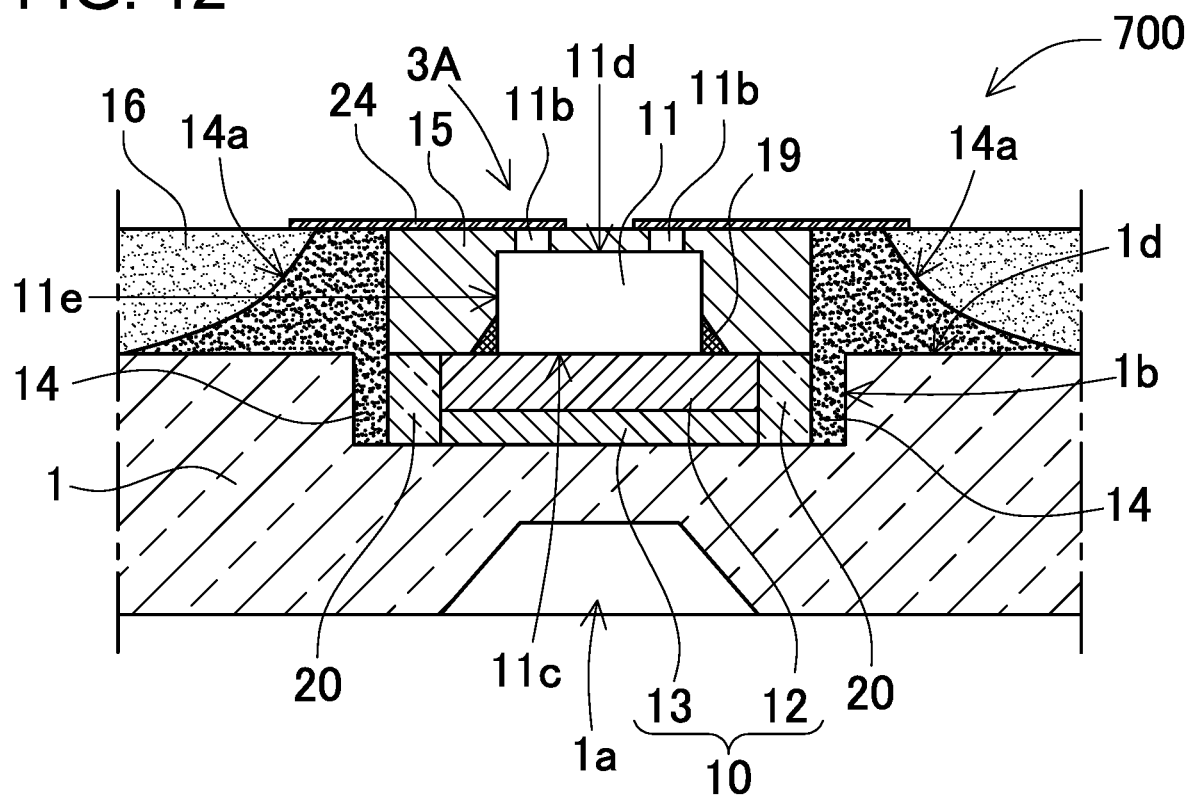
FIG. 12 is an enlarged cross-sectional view schematically showing a light emitting module according to a seventh embodiment of the present disclosure.

A light emitting module 700 according to a seventh embodiment is shown in a schematic cross-sectional view of FIG. 12. The components according to this illustrated light emitting module similar to the foregoing first embodiment are also attached with the same reference signs as the first embodiment, and their description is omitted. The light emitting module 700 according to the seventh embodiment further includes a light-transmissive resin portion 20 on the exterior side-surfaces of the light-transmissive member 10 of a light emitting device 3A. This light-transmissive resin portion 20 can protect the exterior side surfaces of the wavelength conversion member 12 and the light diffusion portion 13 in a light emitting device 3 separation step discussed later. The light-transmissive resin portion 20 can be formed of a light-transmissive resin which has transmittance not smaller than 60%, preferably not smaller than 90%, for example. In the light emitting device 3A, the first light-reflection member 15 contacts the light-transmissive member 10 and the light-transmissive resin portion 20.

Optically Functional Part 1a

Figure 13:
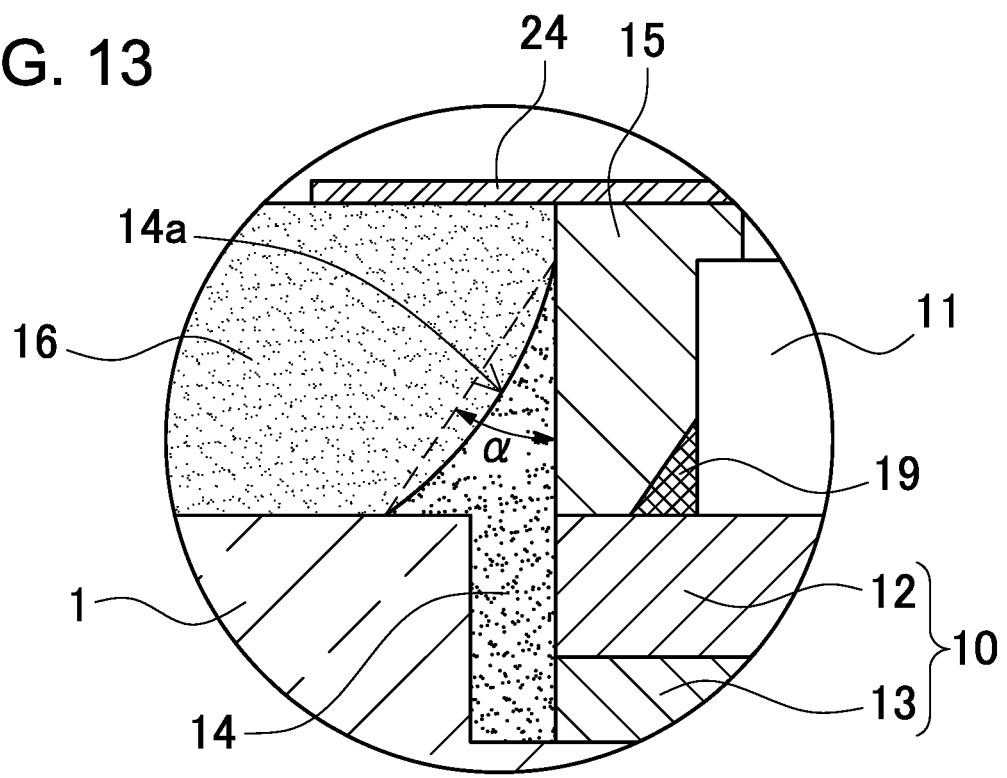
FIG. 13 is an enlarged cross-sectional view schematically showing an inclination angle in the light emitting module.

Optically functional parts 1a for reflection and diffusion of light from the light emitting device 3 can be formed on the light-guide first main-surface 1c side of the light guide plate 1. This light guide plate 1 can diffuse light from the light emitting device 3 in the lateral directions whereby uniformly distributing light emission intensity of the light guide plate 1 in the screen plane. The optically functional part 1a can serve to diffuse light in the light guide plate 1 in the screen plane, for example. The optically functional parts 1a can be formed in a recess which is formed on the light-guide first main-surface 1c side and has a conical (see FIGS. 3 and 5) or pyramid shape (e.g., quadrangular or hexagonal pyramid), a truncated cone (see FIG. 12) or pyramid shape, or the like, for example. In this case, a material (e.g., example, air) which is accommodated in the optically functional part 1a and has a refractive index different from the light guide plate 1 can be used to reflect light emitted from the light emitting device 3 in lateral directions at the inclined surface of the recess as the interface between the light guide plate 1 and this material. Also, the optically functional part 1a may be formed of a light-reflective material (e.g., reflecting film of metal or the like, or a white resin) attached on the inclined surface of the recess. The inclined surface of the optically functional part 1a may be flat (have a straight line as viewed in a cross-sectional view) or curved (have a curved line as viewed in a cross-sectional view). Exemplary curved inclined surfaces 14a are shown in FIGS. 5 and 12. In the case of the curved inclined surface, as shown in an enlarged view of FIG. 13, the inclination angle α is defined by an angle which is formed by the exterior side-surface of the first light-reflection member 15 and a straight line (long dashed line in FIG. 13) that connects the top edge of the inclined surface 14a to the outer edge of the interposition member 14 on the light-guide second main-surface 1d of the light guide plate 1. The top edge of the inclined surface 14a is the edge of the interposition member 14 which covers the exterior side-surface of the first light-reflection member 15. The outer edge of the interposition member 14 is the edge of the part of interposition member 14 which covers the light-guide second main-surface 1d of the light guide plate 1.

The depth of the recess as the optically functional part 1a is dimensioned in consideration of the depth of the aforementioned recessed part 1b. That is, the depths of the optically functional part 1a and the recessed part 1b can be suitably dimensioned so that they are spaced away from each other.

The optically functional parts 1a preferably correspond to the light emitting devices 3, in other words, are preferably arranged at the positions opposed to the light emitting devices 3 which are arranged on the light-guide second main-surface 1d side as discussed later. In particular, the optical axes of the light emitting devices 3 preferably substantially agree with the center axes of the optically functional parts 1a. In this case, the center of the optically functional part 1a which is formed in the light-guide first main-surface 1c agrees with the center of the bottom surface of the recessed part 1b which is formed in the light-guide second main-surface 1d. Accordingly, when the light emitting device 3 is positioned at the center of the recessed part 1b, the optical axis of the light emitting device 3 can easily agree with the center axis of the optically functional part 1a. The size of the optically functional part 1a can be suitably dimensioned.

In the case in which the recessed parts 1b and the optically functional parts 1a are formed in the light guide plate 1, both the light emitting devices 3 and the optically functional parts 1a can be precisely positioned at their positions by the structure that accommodates the light emitting devices 3 in the recessed parts 1b. This structure allows the optically functional parts 1a to accurately uniformly distribute light from the light emitting elements 11. Therefore, a high quality light source for backlights can be provided which has low color unevenness and luminance unevenness. According to the light guide plate 1 which includes the optically functional parts 1a formed on the surface opposite to the recessed parts 1b for accommodating the light emitting devices 3, because the optically functional parts 1a are formed at the positions of the recessed parts 1b for accommodating the light emitting devices 3, the light emitting elements 11 and the optically functional parts 1a can be easily positioned. Therefore, positional deviation can be suppressed.

In the light emitting module 100 which includes a number of light emitting element devices 3 arranged on the light guide plate 1 having a number of recessed parts 1b, the light emitting element devices 3 are arranged in a two-dimensional arrangement (in rows and columns) as viewed in a plan view of the light guide plate 1. Preferably, the light emitting devices 3 are arranged in the recessed parts 1b which are arranged in a two-dimensional arrangement extending along two perpendicularly-intersecting directions (i.e., x and y directions) as shown in FIG. 2. The pitches $p_x$ and $p_y$, which correspond to the x and y directions, respectively, of the recessed parts 1b for accommodating the light emitting devices 3 can be the same as each other as shown in the embodiment of FIG. 2. Alternatively, the pitches corresponding to the x and y directions may be different from each other. The two directions of the two-dimensional arrangement are not necessarily to perpendicularly intersect each other. The pitches corresponding to the x and y directions are not limited to a fixed value, and may vary. For example, the pitches between the recessed parts 1b which accommodate the light emitting devices 3 may increase from the center to the peripheral edges of the light guide plate 1. The pitch between the light emitting devices 3 which are accommodated in the recessed parts 1b refers to the distance between the optical axes of the light emitting devices 3, i.e., the center-to-center distance.

In the aforementioned light emitting module, the recessed parts 1b are formed on the light guide plate 1, and the light emitting devices 3 are accommodated in the recessed parts 1b. Therefore, the light emitting module 100 can be entirely thin. Also, because the recessed part 1b is formed in the light guide plate 1 and the light emitting device 3 is accommodated in the recessed part 1b, the installation accuracy of the light emitting device 3 with respect to the light guide plate 1 can be improved. In particular, in the case in which the wavelength conversion member 12 is fixed onto the light emitting element 11 and the light emitting device 3 which is integrally constructed of the light emitting element 11 and the light-transmissive member 10 is arranged in the recessed part 1b of the light guide plate 1, the installation accuracy of the wavelength conversion member 12 and the light emitting element 11 with respect to the light guide plate 1 can be improved. Therefore, the light emitting module can have good light emission properties. Also, in the case in which light from the light emitting elements 11 passes through the wavelength conversion members 12, and is guided into the light guide plate 1 and then emitted outward in the light emitting module 100, because the light emitting elements 11, the wavelength conversion members 12, and the light guide plate 1 of this light emitting module can be precisely arranged without deviation, this light emitting module can provide excellent light emission properties such as low color unevenness, low luminance unevenness, and the like of light emitted outward from the light guide plate 1.

Also, because the interposition member 14 contacts the exterior side surfaces of the light-transmissive member 10 and the interior side surface of the light guide plate 1 as well as the first light-reflection member 15 which is arranged outside the recessed part 1b, light that exits the light-transmissive member 10 and travels toward the second light reflection-member 16 can be effectively guided in lateral directions of the light emitting device 3. As a result, luminance unevenness is improved. In addition, light that exits the light-transmissive member 10 can be also effectively guided into the light guide plate 1. Therefore, the light extracting efficiency can be improved.

In the case of direct-backlight type liquid crystal displays, because the distance between their liquid crystal panel and light emitting modules is small, the color unevenness and luminance unevenness of the light emitting modules may affect the color unevenness and luminance unevenness of the liquid crystal displays. For this reason, such light emitting modules used in direct-backlight type liquid crystal displays are required to have low color unevenness and luminance unevenness. According to the arrangement of the light emitting module 100 of the embodiment, the color unevenness and luminance unevenness can be reduced although thickness of the light emitting module 100 are thin, for example, not greater than 5 mm, 3 mm, or 1 mm.

In the aforementioned embodiment, the light emitting device 3 has been described to include the wavelength conversion member 12 and the light diffusion portion 13 in the light-transmissive member 10. In the foregoing embodiment, the light emitting device 3 is partially accommodated in the recessed part 1b of the light guide plate 1 so that light emitted by the light emitting element 11 passes through the wavelength conversion member 12 and the light diffusion portion 13, and then enters the light guide plate 1. However, the light-transmissive member of the light emitting device in the light emitting module does not necessarily include both the wavelength conversion member and the light diffusion portion. For example, the light-transmissive member of the light emitting device may include only the wavelength conversion member, and the light diffusion portion may be arranged on the bottom surface of the recessed part of the light guide plate in the light emitting module.

Production Processes of Light Emitting Module 100

The light emitting device 3 is first prepared. FIGS. 14A-14C and 15A-15C show production processes of the light emitting device 3 according to the embodiment.

Figure 14A:
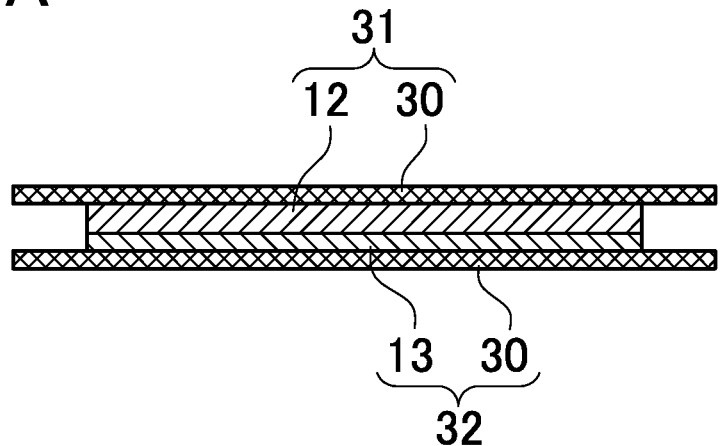
FIGS. 14A to 14C are enlarged cross-sectional views schematically showing exemplary production processes of a light emitting element unit.
Figure 14B:
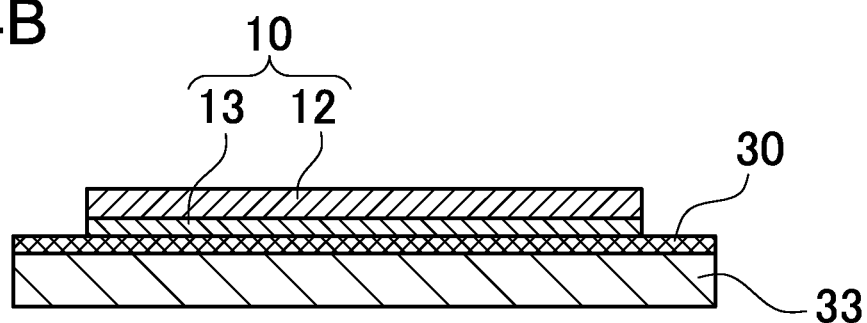

In processes shown in FIGS. 14A and 14B, a light-transmissive member 10 resin which covers the element main-light-emission surface 11c of the light emitting element 11 is formed. The illustrated light-transmissive member 10 resin is a laminated structure which is constructed of the wavelength conversion member 12 resin and the light diffusion portion 13 resin.

In the process shown in FIG. 14A, a first sheet 31 which includes a uniform-thickness wavelength conversion member 12 resin on the surface of a base sheet 30 is arranged onto a second sheet 32 which include a uniform-thickness light diffusion portion 13 resin on the surface of another base sheet 30 so that the wavelength conversion member 12 resin is fixed onto the light diffusion portion 13 resin. In the case in which the wavelength conversion member 12 resin and the light diffusion portion 13 resin are formed of thermosetting resin as the base material, after they are arranged as discussed above in a semi-cured condition they can be fixed onto each other by curing. Alternatively, the wavelength conversion member 12 resin and the light diffusion portion 13 resin can be fixed onto each other by a light-transmissive bonding member. The wavelength conversion member 12 resin and the light diffusion portion 13 resin may be stuck onto the base sheets 30 by adhesion layers to be easily unstuck, for example.

In the process shown in FIG. 14B, the base sheet 30 of the second sheet 32 is arranged on a plate 33 from which the base sheet 30 can be unstuck, and the base sheet 30 which is stuck on the wavelength conversion member 12 resin of the first sheet 31 is then unstuck.

Figure 14C:
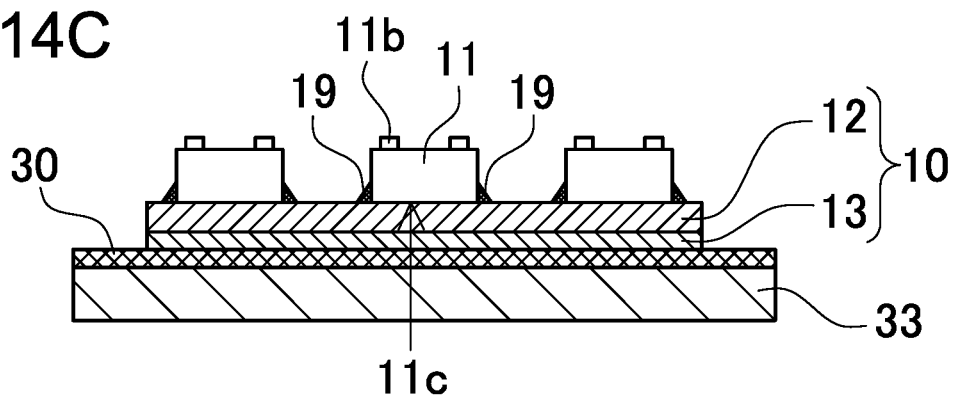

In the process shown in FIG. 14C, the light emitting elements 11 are fixed onto the light-transmissive member 10 resin. Specifically, the element main-light-emission surface 11c of the light emitting element 11 is fixed onto the light-transmissive member 10 resin. In the case in which the light-transmissive member 10 resin is constructed of the wavelength conversion member 12 resin and the light diffusion portion 13 resin, the light emitting elements 11 are spaced away at a predetermined interval from each other and fixed onto the wavelength conversion member 12 of the light-transmissive member 10 resin.

The light emitting element 11 is fixed onto the light-transmissive member 10 resin by the light-transmissive adhesion member 19. The light-transmissive adhesion member 19 is applied onto the light-transmissive member 10 resin and/or the element main-light-emission surface 11c of the light emitting element 11, and fixes the light-transmissive member 10 resin onto the light emitting element 11. At this time, as shown in FIG. 14C, the applied light-transmissive adhesion member 19 is squeezed out of the recessed part and extends upward along the element side-surface 11e of the light emitting element 11 so that the light-transmissive adhesion member 19 covers parts of the element side-surfaces 11e of the light emitting element 11. The light-transmissive adhesion member 19 can be formed between the light-transmissive member 10 resin and the element main-light-emission surface 11c of the light emitting element 11.

Figure 15A:
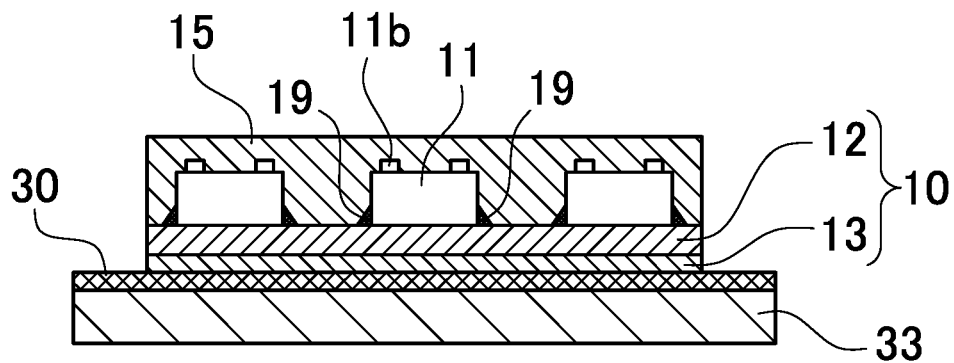
FIGS. 15A to 15C are enlarged cross-sectional views schematically showing exemplary production processes of the light emitting element unit.
Figure 15B:
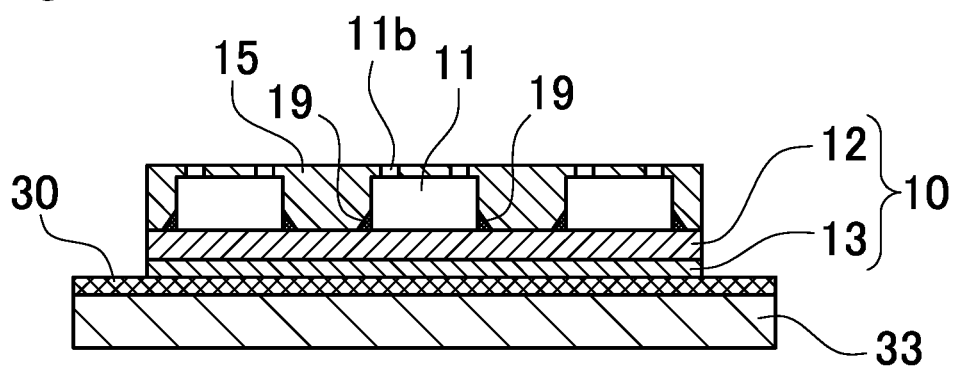
Figure 15C:
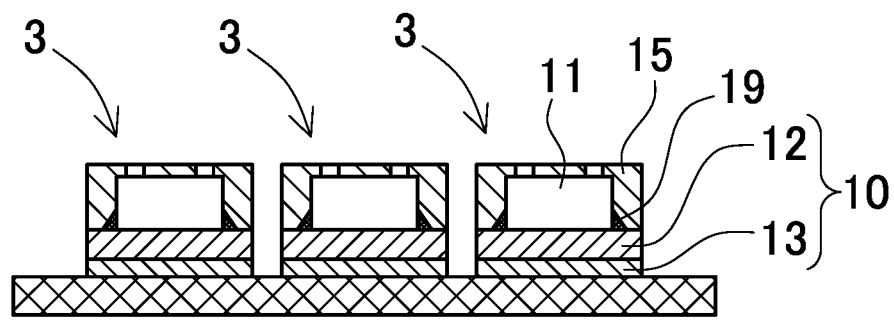

The interval between the light emitting elements 11 is dimensioned so that the exterior shape of the light-transmissive member 10 has a predetermined size after parts between the light emitting elements 11 are cut along intermediate lines as shown with FIG. 15C. The reason is that the exterior shape of the light-transmissive member 10 is defined by the interval between the light emitting elements 11.

In the process shown in FIG. 15A, the first light-reflection member 15 resin is formed so that the light emitting elements 11 are completely placed inside this first light-reflection member 15. The first light-reflection member 15 resin is preferably white resin. The first light-reflection member 15 resin is cured after formed on the light-transmissive member 10 resin and over the light emitting elements 11 (the light emitting elements 11 are completely placed inside the first light-reflection member 15 resin). The thickness of the first light-reflection member 15 resin is dimensioned so that the light emitting elements 11 are completely placed inside the first light-reflection member 15 resin. Specifically, in the example of FIG. 15A, the thickness of the first light-reflection member 15 resin is dimensioned so that the first light-reflection member 15 resin is formed over the element electrodes 11b of the light emitting element 11. The first light-reflection member 15 resin can be formed by compression molding, transfer molding, application, or the like.

In the process shown in FIG. 15B, the element electrodes 11b of the light emitting element 11 are exposed by partially removing the cured first light-reflection member 15. Although not illustrated, the electrode protection terminals may be formed on the parts of the element electrode 11b which are exposed from the first light-reflection member 15 by using an electrically conducting film. In this case, such an electrically conducting film (e.g., copper, nickel, and gold) are formed on the surface of the first light-reflection member 15 by sputtering or the like, and connected to the element electrodes 11b. After that, the electrically conducting film is partially removed so that electrically conducting film parts are positioned on the element electrodes 11b and serve as electrode protection terminals of the light emitting devices 3. The electrically conducting film can be removed by dry etching, wet etching, laser ablation, or the like.

In the process shown in FIG. 15C, the first light-reflection member 15 resin and the light-transmissive member 10 resin are cut along the intermediate lines for separation into the light emitting devices 3. In the separated light emitting device 3, the light emitting element 11 is fixed onto the light-transmissive member 10, and the first light-reflection member 15 is arranged on the upper and side surfaces of the light emitting element 11 so that the element electrodes 11b are exposed on the upper surface of the first light-reflection member 15.

All the aforementioned preparation processes of the light emitting device may be conducted or some of them may be conducted. Alternatively, the light emitting device may be prepared by purchase.

The light emitting device 3 which is produced by the aforementioned processes is accommodated into the recessed part 1b of the light guide plate 1 in processes shown in FIGS. 16A-16C and 17A-17C.

The light guide plate 1 is first prepared which has the recessed part 1b in the light-guide second main-surface 1d.

Figure 16A:
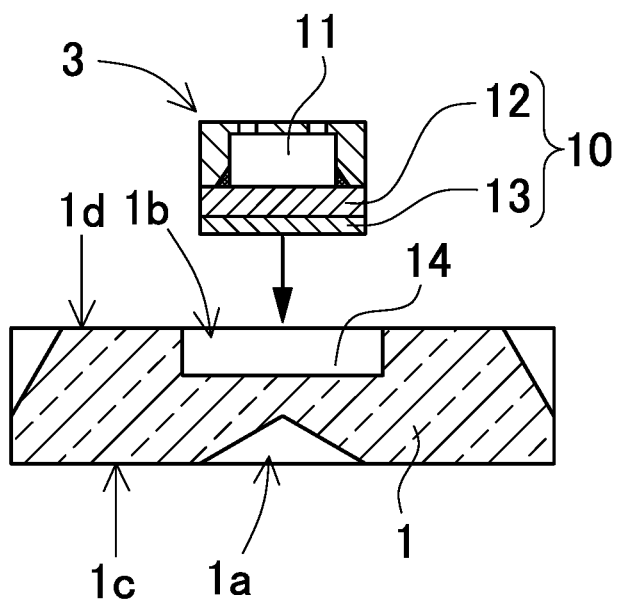
FIGS. 16A to 16C are enlarged cross-sectional views schematically showing exemplary production processes of a light emitting module.
Figure 16B:
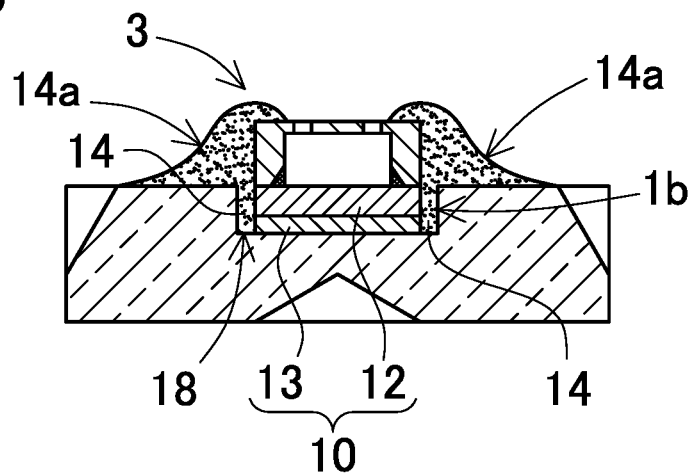

The light guide plate 1 is formed of a thermoplastic resin such as polycarbonate, for example. As shown in FIGS. 16A and 16B, the recessed part 1b is formed in the light-guide second main-surface 1d.

The light guide plate 1 can be formed by ejection molding, transfer molding, compression molding, or the like, for example. The light guide plate 1 can be formed by a die for forming a shape having the recessed part 1b. In this case, the light guide plates can be inexpensively mass-produced while reducing misalignment of the recessed parts 1b. It is noted that the recessed parts can be formed by cutting by using an NC processing machine or the like after the light guide plate is formed into a certain plate shape. Also, the optically functional part 1a which has a conical shape for example can be formed in the light-guide first main-surface 1c.

The light emitting device 3 is fixed into the recessed part 1b of the light guide plate 1. More specifically, after the light-transmissive interposition member 14 in a liquid state is applied into the recessed part 1b, a part of light emitting device 3 is accommodated into the recessed part 1b. In more detail, the light-transmissive member 10 of the light emitting device 3 is opposed to the bottom surface of the recessed part 1b. A certain part of the first light-reflection member is located out of the recessed part 1b.

After the center of the light-transmissive member 10 agrees with the center of the recessed part 1b as viewed in a plan view, the light emitting device 3 is fixed to the light guide plate 1 by curing the liquid interposition member 14.

The interior-side size of the recessed part 1b is larger than the exterior-side size of the light emitting device 3 as viewed in a plan view. When the part of the light emitting device 3 is accommodated in the recessed part 1b, a space 18 is created between the interior side-surfaces of the recessed part 1b and the exterior side-surfaces of the light emitting device 3. The space 18 is filled up with the uncured interposition member 14 which is applied into the recessed part 1b.

The application quantity of the interposition member 14 to be applied into the recessed part 1b is adjusted so that the interposition member 14 is extruded from the space 18 between the interior side-surfaces of the recessed part 1b and the exterior side-surfaces of the light emitting device 3 to the outside of the recessed part 1b. The part of the interposition member 14 which is extruded from the recessed part 1b extends upward to the first light-reflection member 15 in parts of side surfaces. That is, the part of the interposition member 14 covers parts of side surfaces of the first light-reflection member 15. In addition, the part of the interposition member 14 laterally extends on the light-guide second main-surface 1d. That is, the part of the interposition member 14 covers parts of the light-guide second main-surface 1d. When the interposition member 14 is extruded from the recessed part 1b, the upper surface of the interposition member 14 will include the inclined surfaces 14a which extends from the upper end of the light emitting device 3 toward the outside as viewed in a vertical cross-sectional view. The inclined surface 14a of the interposition member 14 forms an acute angle with the exterior side-surface of the first light-reflection member 15. This inclination angle α preferably falls within the range 5° to 50°.

The application quantity of the interposition member 14 to be applied into the recessed part 1b can be specified so that the interposition member 14 which covers the exterior side-surfaces of the light emitting device 3 is higher than the light-guide second main-surface 1d of the light guide plate 1, in other words, the applied interposition member 14 is squeezed out of the recessed part 1b when the light emitting device 3 is fixed into the recessed part 1b. However, the application quantity of the interposition member 14 is adjusted so that the intersection of the inclined surface 14a of the interposition member 14 and the exterior side-surface of the first light-reflection member 15 is lower than the edge of the exterior side-surface of the light emitting device 3 on its electrode side.

Also, after the light emitting device 3 is fixed to the light guide plate 1, the uncured interposition member 14 may be applied into the space 18 so that the part of the interposition member 14 covers parts of side surfaces of the first light-reflection member 15. In other words, when the light emitting device 3 is partially accommodated in the recessed part 1b, a certain amount of the interposition member 14 is first applied which can be accommodated in the recessed part 1b. An additional amount of the interposition member 14 is then applied so as to cover the exterior side-surfaces of the light emitting device 3 (the exterior side-surfaces of the first light-reflection members 15, in more detail). In this case, the application quantity of the interposition member 14 is adjusted not to cover the entire exterior side-surfaces of the light emitting device 3. In addition, it is more preferable that the application quantity of the interposition member 14 is adjusted to cover a part of light-guide second main-surface 1d of the light guide plate 1.

Figure 16C:
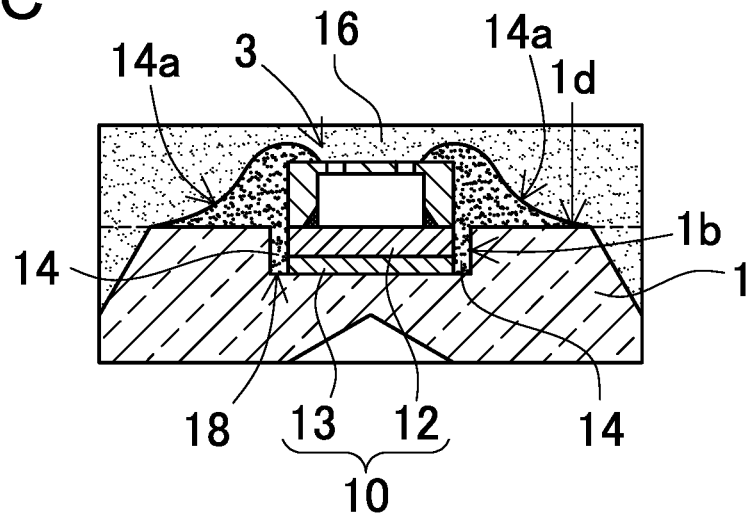

After the light emitting device 3 is fixed to the light guide plate 1, the second light-reflection member 16 is formed on the light-guide second main-surface 1d of the light guide plate 1 in the process shown in FIG. 16C. The thickness of the second light-reflection member 16 is specified so that the light emitting device 3 is completely placed inside the second light-reflection member 16.

Figure 17A:
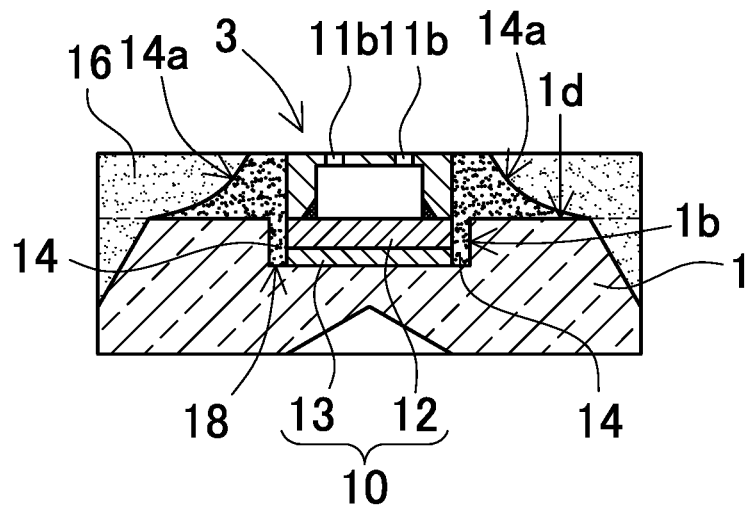
FIGS. 17A to 17C are enlarged cross-sectional views schematically showing exemplary production processes of the light emitting module.

In the process shown in FIG. 17A, the element electrodes 11b are exposed by partially removing the second cured light-reflection member 16.

In the process shown in FIG. 16C, although the thickness of the second light-reflection member 16 is specified so that the light emitting device 3 is completely placed inside the second light-reflection member 16, the thickness of the second light-reflection member 16 may be adjusted so that the surface of the second light-reflection member 16 is coplanar with or lower than the surfaces of the element electrodes 11b. In this case, the aforementioned removing process can be omitted.

Figure 17B:
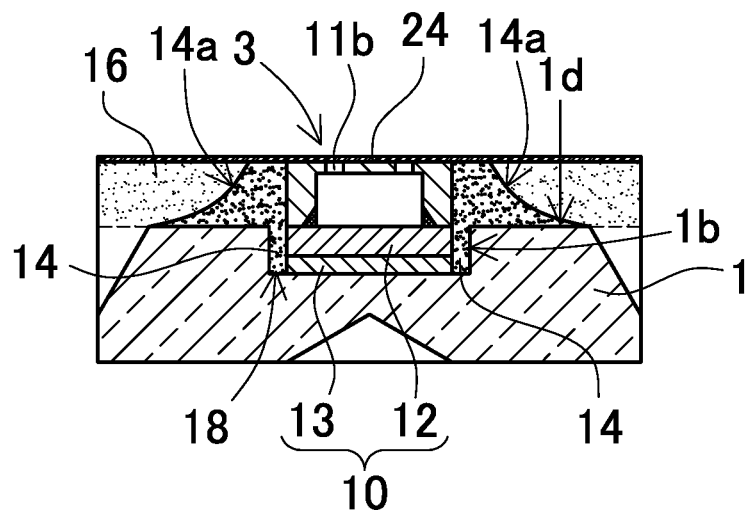

In the process shown in FIG. 17B, the electrically conducting film 24 is formed on the surfaces of the second light-reflection member 16 and the first light-reflection member 15. In this process, the electrically conducting film 24 which is formed of Cu/Ni/Au for example is formed on substantially the entire surfaces of the element electrodes 11b of the light emitting element 11, the first light-reflection member 15, and the second light-reflection member 16 by sputtering or the like.

Figure 17C:
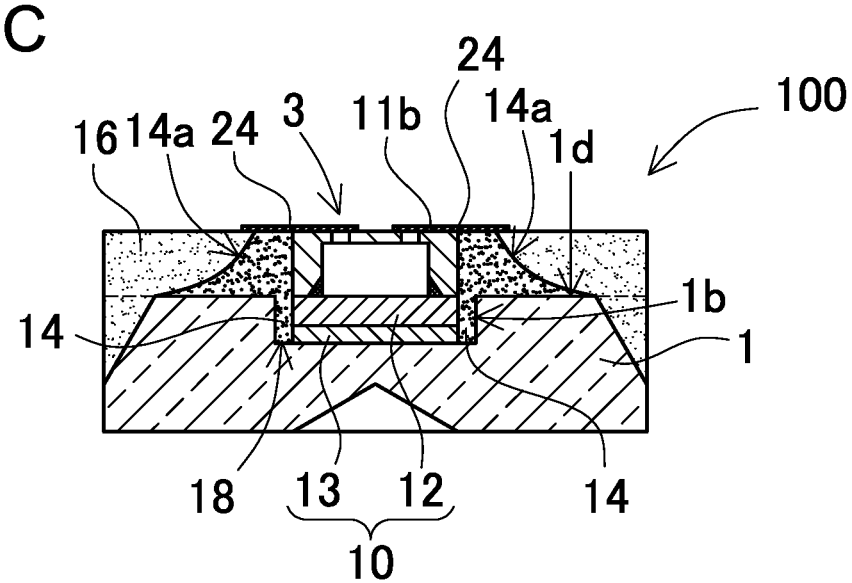

In the process shown in FIG. 17C, a part of the electrically conducting film 24 between the element electrodes 11b is removed.

In the aforementioned processes, the light emitting module 100 which includes a single or a plurality of light emitting devices 3 in the light guide plate 1 is produced.

Production Method of Light Emitting Module 700

The light emitting device 3A of the light emitting module 700 shown in FIG. 12 is produced as follows.

Figure 18A:
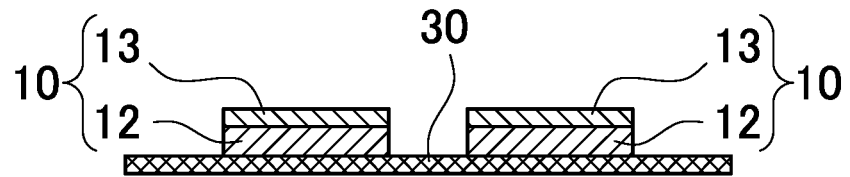
FIGS. 18A to 18D are enlarged cross-sectional views schematically showing exemplary production processes of a light emitting element unit according to a modified embodiment of the present disclosure.

In the process shown in FIG. 18A, the light-transmissive members 10 are formed. The illustrated light-transmissive member 10 is a laminated structure of the wavelength conversion member 12 and the light diffusion portion 13 which have a predetermined size.

Figure 18B:
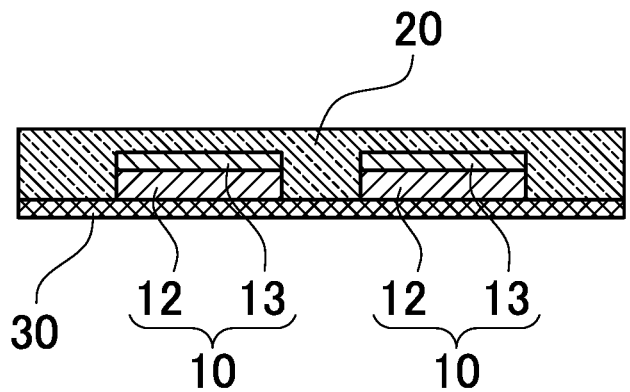
Figure 18C:
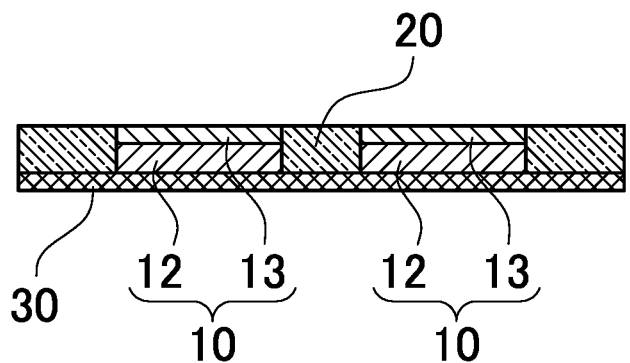

In the process shown in FIG. 18B, the light-transmissive resin portion 20 resin is formed so that the light-transmissive members 10 are completely placed inside this the light-transmissive resin portion 20 resin. The exterior side-surfaces of the wavelength conversion member 12 and the light diffusion portion 13 are covered and protected by the light-transmissive resin portion 20. Subsequently, in the process shown in FIG. 18C, the light-transmissive resin portion 20 resin is partially removed after cured so that the light diffusion portion 13 is exposed.

Figure 18D:
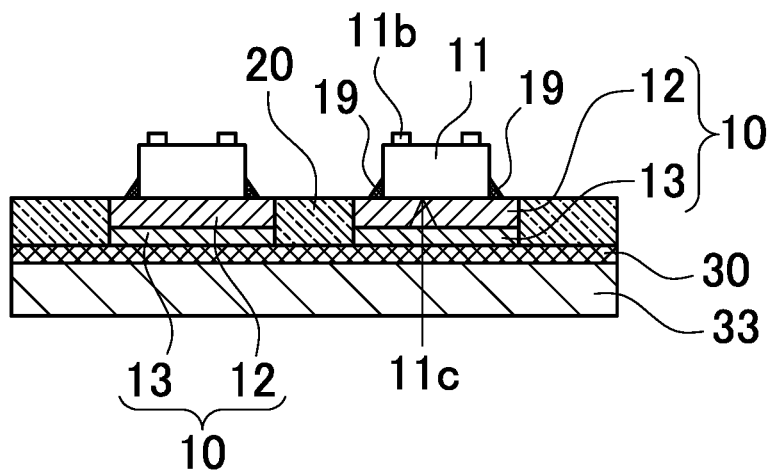

As shown with FIG. 18D, the light-transmissive member 10 is placed on the base sheet 30 which is placed on the plate 33 so that the light diffusion portion 13 contacts the base sheet 30. Subsequently, the light emitting elements 11 are fixed onto the light-transmissive members 10. The light-transmissive adhesion member 19 is applied onto the light-transmissive member 10 and/or the element main-light-emission surface 11c of the light emitting element 11, and fixes the element main-light-emission surface 11c onto the light-transmissive member 10. The light emitting element 11 is fixed onto the wavelength conversion member 12 of its corresponding one light-transmissive member 10 so that the center of the element main-light-emission surface 11c of the light emitting element 11 substantially agrees with the center of the light-transmissive member 10 as viewed in a top plan view.

Figure 19A:
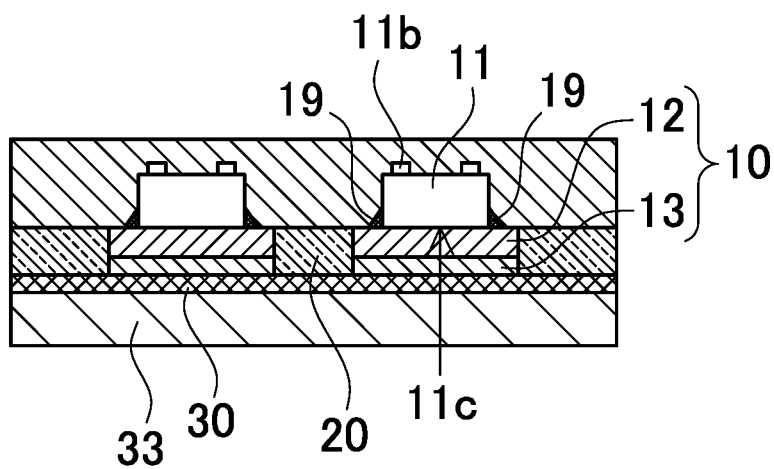
FIGS. 19A to 19C are enlarged cross-sectional views schematically showing exemplary production processes of the light emitting element unit according to the modified embodiment of the present disclosure.
Figure 19B:
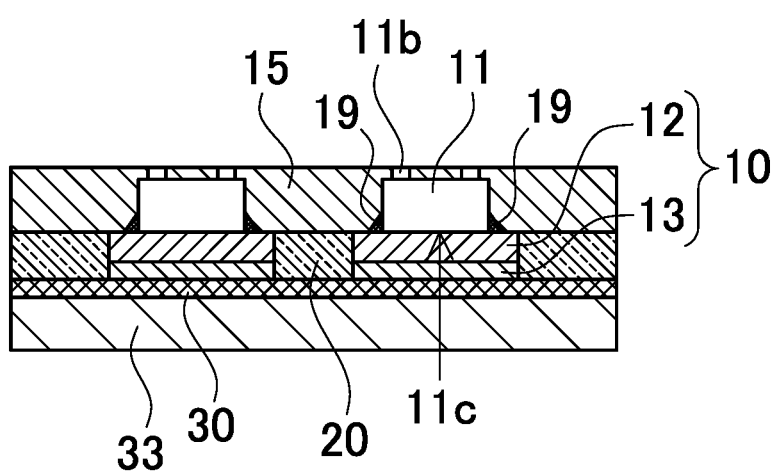

In the process shown in FIG. 19A, the first light-reflection member 15 resin is formed so that the light emitting elements 11 are completely placed inside this first light-reflection member 15. The first light-reflection member 15 resin is cured after applied onto the light-transmissive member 10 resin and over the light emitting elements 11 (the light emitting elements 11 are completely placed inside the first light-reflection member 15 resin). Subsequently, in the process shown in FIG. 19B, the element electrodes 11b of the light emitting element 11 are exposed by partially removing the cured first light-reflection member 15.

Figure 19C:
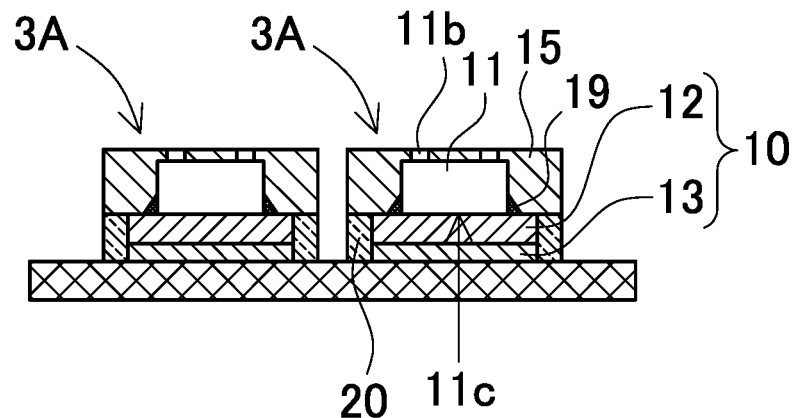

In the process shown in FIG. 19C, the first light-reflection member 15 resin and the light-transmissive resin portion 20 resin are cut along the intermediate lines for separation into the light emitting devices 3A. In the separated light emitting device 3A, the outer peripheral surfaces of the laminated structure of the light-transmissive member 10, which is constructed of the wavelength conversion member 12 and the light diffusion portion 13, are covered by the light-transmissive resin portion 20 resin. The light emitting element 11 is fixed to this light-transmissive member 10. The first light-reflection member 15 is arranged on the upper and side surfaces of the light emitting element 11 so that the element electrodes 11b are exposed on the upper surface of the first light-reflection member 15.

After the light emitting device 3A which is produced in the aforementioned processes is fixed into the recessed part 1b of the light guide plate 1, the second light-reflection member 16 is formed and covers the light-guide second main-surface 1d of the light guide plate 1 and the light emitting device 3A similar to the aforementioned processes shown in FIGS. 16A-16C and 17A-17C. Finally, the light emitting module 700 is produced.

Another Production Method

Figure 20A:
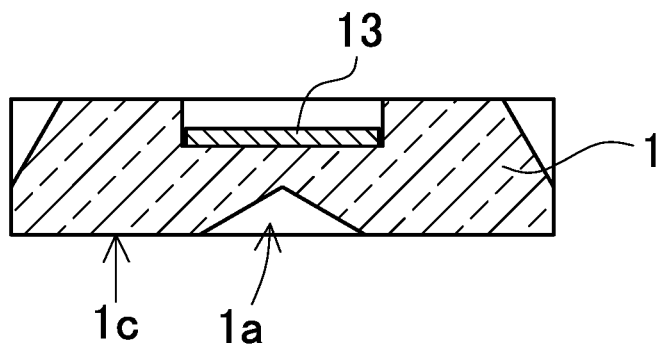
FIGS. 20A to 20D are enlarged cross-sectional views schematically showing exemplary production processes of a light emitting module according to a modified embodiment of the present disclosure.
Figure 20B:
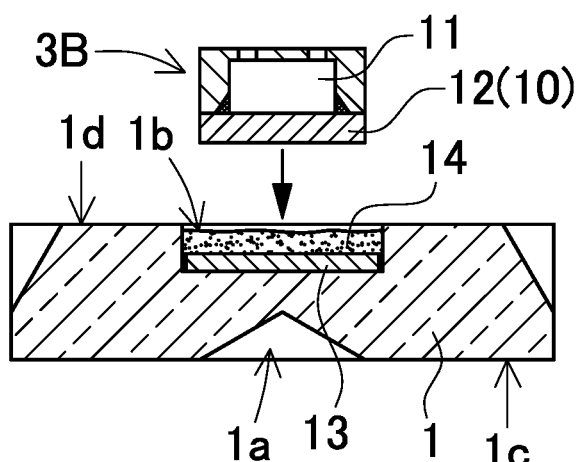
Figure 20C:
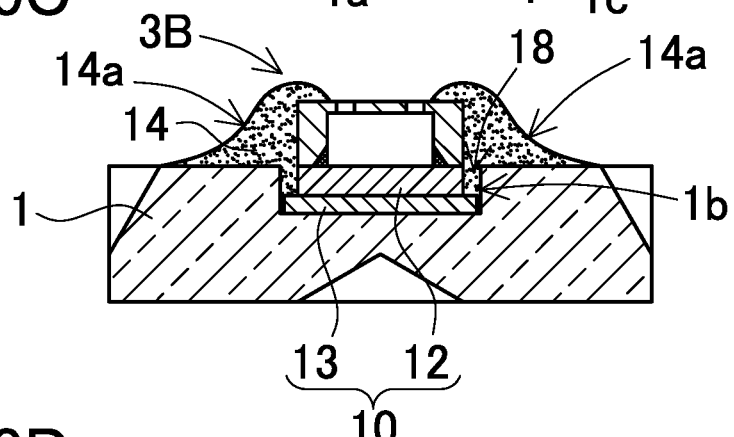
Figure 20D:
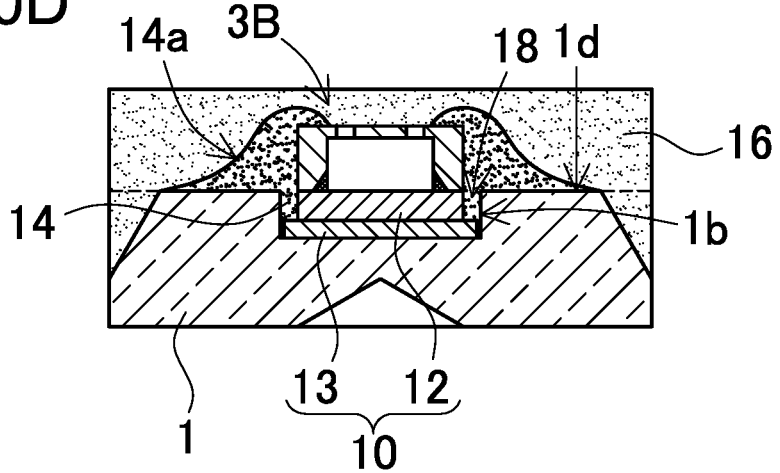
Figure 21:
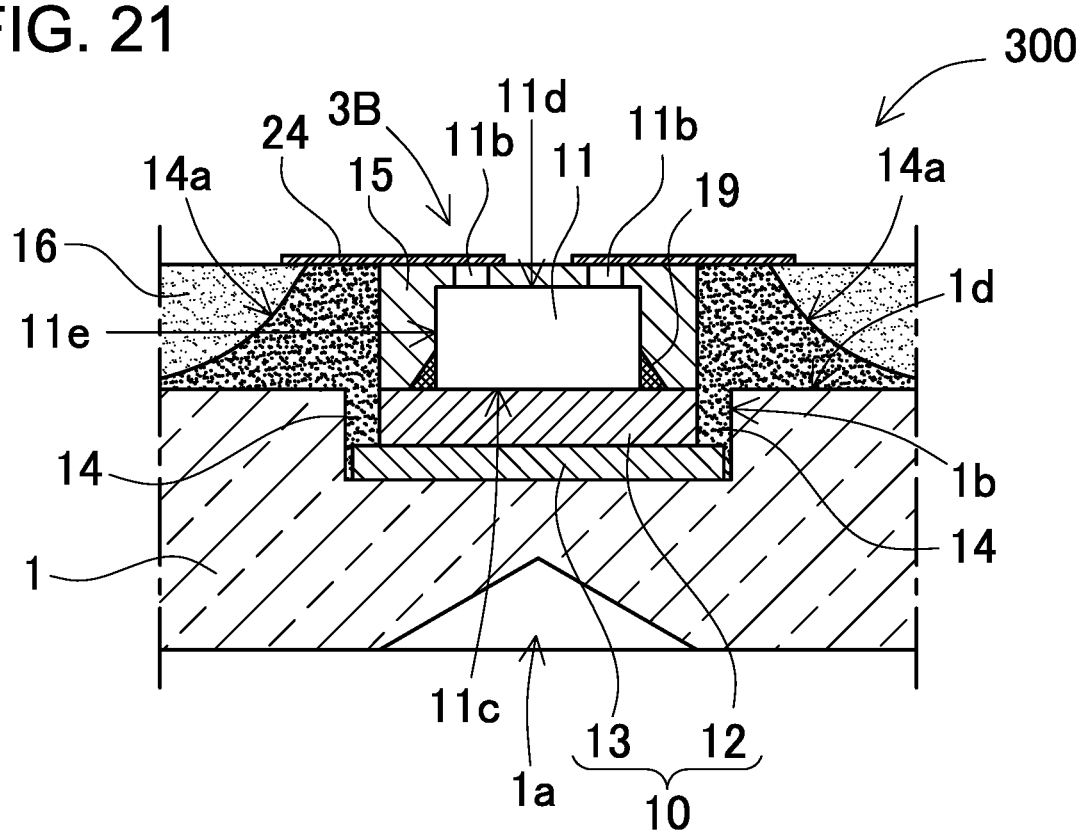
FIG. 21 is an enlarged cross-sectional view schematically showing a light emitting module according to a modified embodiment of the present disclosure.

FIGS. 20A-20D show production processes of a light emitting module 300 shown in FIG. 21. The light emitting module 300 includes a light emitting device 3B which includes only the wavelength conversion member 12 in the light-transmissive member 10. This light emitting device 3B is fixed into the recessed part 1b which is formed in the light guide plate 1. In the light emitting module 300, the light diffusion portion 13 is arranged on the bottom surface of the recessed part 1b before the light emitting device 3B is accommodated in the recessed part 1b. In this light emitting device 3B, after the light emitting element 11 is fixed onto the surface of the wavelength conversion member 12, the first light-reflection member 15 is arranged on the surfaces of the wavelength conversion member 12 and the light emitting element 11 similar to the processes shown in FIGS. 15A-15C. Thus, the light emitting device 3B which includes only the wavelength conversion member 12 in the light-transmissive member 10 is produced.

The light emitting module 300 is produced by the following processes.

In the process shown in FIG. 20A, the light diffusion portion 13 is arranged on the bottom surface of the recessed part 1b of the light guide plate 1. The light diffusion portion 13 can be formed by fixing a light diffusion portion which is previously formed in a plate or sheet shaped having a predetermined size onto the bottom surface of the recessed part 1b, or by printing or applying a material of the light diffusion portion on the bottom surface of the recessed part 1b.

As shown in FIG. 20B, the light emitting device 3B is fixed into the recessed part 1b after the light diffusion portion 13 is arranged on the bottom surface. After the uncured light-transmissive interposition member 14 in a liquid state is applied into the recessed part 1b, the light emitting device 3B is partially accommodated in the recessed part 1b so that the light-transmissive member 10 is opposed to the light diffusion portion 13. The light emitting device 3B is then fixed to the light guide plate 1 by curing the uncured interposition member 14.

The space 18 between the interior side-surfaces of the recessed part 1b and the exterior side-surfaces of the light emitting device 3B is filled up with the uncured interposition member 14 which is applied into the recessed part 1b when the light emitting device 3B is partially accommodated in the recessed part 1b. At this time, the uncured interposition member 14 will be extruded from the recessed part 1b so that the interposition member 14 is shaped. Similar to the aforementioned method, the part of the interposition member 14 which is extruded from the recessed part 1b extends upward to the first light-reflection member 15 in parts of side surfaces. That is, the part of the interposition member 14 covers parts of side surfaces of the first light-reflection member 15. In addition, the upper surface of the interposition member 14 will include the inclined surfaces 14a which extends from the upper end of the light emitting device 3 toward the outside as viewed in a vertical cross-sectional view.

After the light emitting device 3 is fixed to the light guide plate 1, the second light-reflection member 16 is formed on the light-guide second main-surface 1d of the light guide plate 1 in the process shown in FIG. 20D. A white resin is used for the second light-reflection member 16. The thickness of the second light-reflection member 16 is specified so that the light emitting device 3 is completely placed inside the second light-reflection member 16.

Subsequently, similar to FIGS. 17A-17C, the surface of the second light-reflection member 16 is ground so that the element electrodes 11b are exposed from the surface. After that, the electrically conducting film 24 is laminated on the surfaces of the second light-reflection member 16 and the first light-reflection member 15. Finally, the light emitting module 300 shown in FIG. 21 is produced by removing a part of the electrically conducting film 24.

In the light emitting module 100 according to the foregoing embodiment, the light emitting devices 3 may be wired to be driven independently from each other. The light guide plate 1 may have two or more areas. In this case, the light emitting devices 3 are grouped into two or more groups to which the light emitting devices 3 belong. The light emitting devices 3 that belong to one group are electrically connected in series or in parallel to each other so that they are connected to their common circuit. Thus, two or more groups of light emitting devices can be provided. Such grouping allows the light emitting module to provide local dimming.

One light emitting module 100 according to the foregoing embodiment may be used as a backlight of one liquid crystal display. Also, a number of light emitting modules 100 can be arranged side by side, and used as a backlight of one liquid crystal display 1000. In the case in which a number of small light emitting modules 100 are produced and inspected for defects, their yield can be improved as compared with the case where large light emitting modules 100 which include a larger number of light emitting elements 11 are produced.

Figure 22:
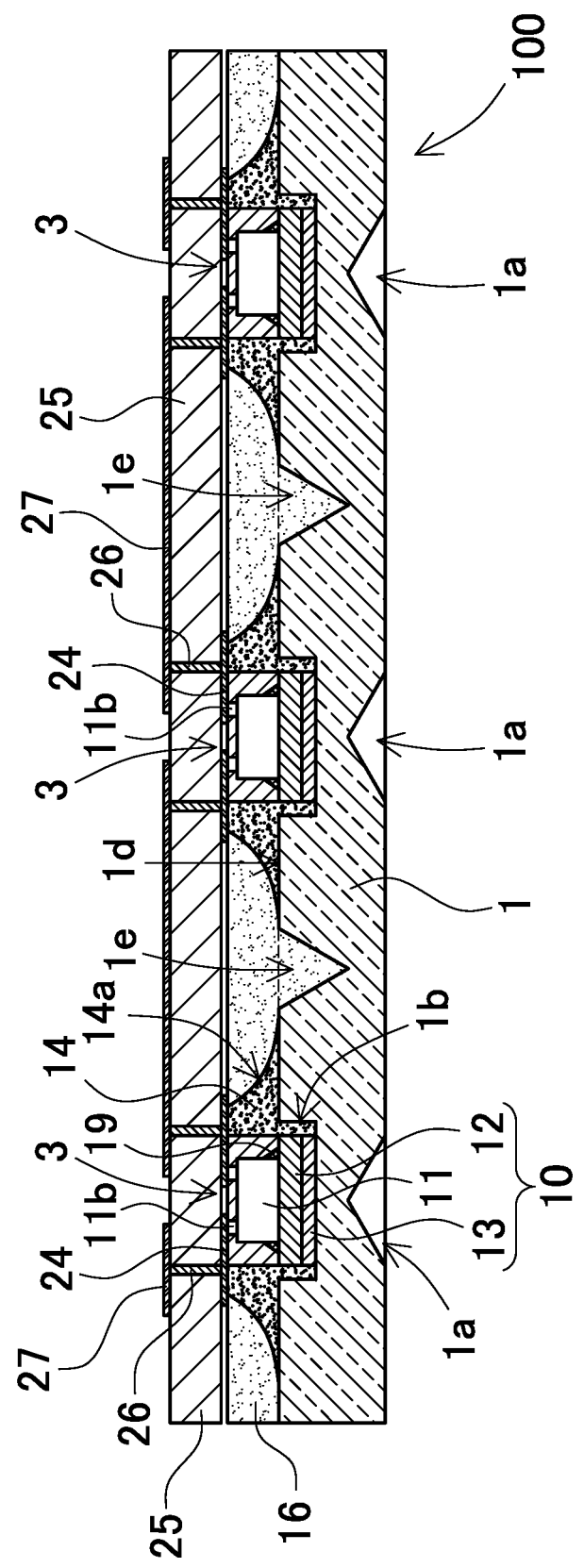
FIG. 22 is an enlarged cross-sectional view schematically showing an example of a light emitting module shown in FIG. 3 and a circuit board which is connected to this light emitting module.

The light emitting module 100 may include a wiring board 25 as shown in FIG. 22. For example, the wiring board 25 includes an electrically insulating base member, electrically conductive members 26, and wiring layer parts 27. A number of via holes are formed in the electrically insulating base member, and are filled with the electrically conductive members 26. The wiring layer parts 27 are formed on the both sides of the base member, and are electrically connected to the electrically conductive members 26. The element electrodes 11b are electrically connected to the wiring board 25.

A single light emitting module 100 can be fixed onto a single wiring board. Alternatively, two or more light emitting modules 100 may be fixed onto a single wiring board. In the latter, electric connection terminals for external electrical connection (e.g., connectors) can be concentrated (in other words, a connector is not required for each light emitting module). As a result, the structure of the liquid crystal display 1000 can be simplified.

Also, two or more wiring boards each of which includes two or more light emitting modules 100 can be arranged, and serve as a backlight of one liquid crystal display 1000. In this case, the two or more wiring boards can be arranged on a frame or the like, for example, and be connected to an external power supply through their connectors or the like.

Also, an additional light-transmissive member which has a light diffusion function and the like may be additionally laminated on the light guide plate 1. In this case, when the optically functional parts 1a are recessed parts, the opening (the part near the light-guide first main surface 1c of the light guide plate 1) of the recessed parts will be closed. It is preferable that the recessed parts are not filled with the additional light-transmissive member. The reason is that an air layer can be formed in the recessed part as the optically functional part 1a so that light from the light emitting element 11 can be widely distributed.

The light emitting module according to the present disclosure can be suitably used as backlights of televisions, tablets, and liquid crystal displays for televisions, tablets, smart phones, smart watches, head-up displays, digital signages, signboards, and the like. Also, the light emitting module according to the present disclosure can be used as light sources for lighting, as well as emergency lights, line lighting, various types of illuminations, car monitors, and the like.

It should be apparent to those with an ordinary skill in the art that while various preferred embodiments of the invention have been shown and described, the invention is not limited to the particular embodiments disclosed, which are deemed to be merely illustrative of the inventive concepts, and which are suitable for all modifications and changes falling within the scope of the invention as defined in the appended claims.

What is claimed is:

1. A light emitting module comprising:
  a light emitting element unit comprising
    a light emitting element that includes an element main-light-emission surface, an element electrode-formation surface opposed to the element main-light-emission surface, and an element side-surface extending between the element main-light-emission surface and the element electrode-formation surface,
    a light-transmissive member that covers the element main-light-emission surface, and a first light-reflection member that covers the element electrode-formation surface;

a light-transmissive light guide plate including a light-guide first main-surface that serves as a light emission surface through which light exits, and a light-guide second main-surface that is opposed to the light-guide first main-surface and defines an accommodation space that accommodates the light emitting unit;

a light-transmissive interposition member that is partially arranged in the accommodation space in contact with an exterior side-surface of the light emitting element unit and has a hardness lower than a hardness of the first light-reflection member; and a second light-reflection member that covers a part of the light-guide second main-surface and a part of the interposition member and has a hardness higher than the hardness of the interposition member.

2. The light emitting module according to claim 1, wherein the first light-reflection member is at least partially arranged out of the accommodation space in a vertical cross-section.

3. The light emitting module according to claim 1, wherein the second light-reflection member is at least partially spaced away from the first light-reflection member so that the interposition member is exposed from the second light-reflection member in a spaced area in a plan view from the light-guide second main-surface.

4. The light emitting module according to claim 1, wherein the hardness of the second light-reflection member is not smaller than the first light-reflection member.

5. The light emitting module according to claim 1, wherein at least one of the first light-reflection member, the second light-reflection member, and the interposition member includes a resin.

6. The light emitting module according to claim 1, wherein the light emitting element unit has a roughly rectangular shape in a plan view, and wherein the interposition member has a width at an end of a side of the rectangular light emitting element unit smaller than in a central part of the side, which is located between the end and another end of the side, in a plan view.

7. The light emitting module according to claim 1, wherein the second light-reflection member includes a second light-reflecting connection surface that faces the light-guide second main-surface of the light guide plate, and a second light reflection main-surface that is opposed to the second light-reflecting connection surface, and wherein an interface between the interposition member and the second light-reflection member on the second light reflection main-surface is located outside an end surface of the light-transmissive member in a vertical cross-sectional view.

8. The light emitting module according to claim 1, wherein the second light-reflection member includes a second light-reflecting connection surface that faces the light-guide second main-surface of the light guide plate, and a second light reflection main-surface that is opposed to the second light-reflecting connection surface, and wherein an interface between the interposition member and the second light-reflection member on the second light reflection main-surface is located outside an end surface of the accommodation space in a vertical cross-sectional view.

9. The light emitting module according to claim 1, comprising a plurality of light emitting element units and a plurality of interposition members as the light emitting element unit and the interposition member, wherein the light guide plate defines a plurality of accommodation spaces as the accommodation space, wherein each of the plurality of accommodation spaces accommodates a corresponding light emitting element unit and a corresponding interposition member, and wherein an interface between the interposition member and the second light-reflection member is inclined in a vertical cross-sectional view and includes an inclined surface of the interposition member.

10. The light emitting module according to claim 9, wherein the inclined surface of the interposition member is a concave surface.

11. The light emitting module according to claim 9, wherein the inclined surface of the interposition member is a convex surface.

12. The light emitting module according to claim 2, wherein the hardness of the second light-reflection member is not smaller than the first light-reflection member.

13. The light emitting module according to claim 2, wherein the light emitting element unit has a roughly rectangular shape in a plan view, and wherein the interposition member has a width at an end of a side of the rectangular light emitting element unit smaller than in a central part of the side, which is located between the end and another end of the side, in a plan view.

14. The light emitting module according to claim 2, wherein the second light-reflection member includes a second light-reflecting connection surface that faces the light-guide second main-surface of the light guide plate, and a second light reflection main-surface that is opposed to the second light-reflecting connection surface, and wherein an interface between the interposition member and the second light-reflection member on the second light reflection main-surface is located outside an end surface of the light-transmissive member in a vertical cross-sectional view.

15. The light emitting module according to claim 2, wherein the second light-reflection member includes a second light-reflecting connection surface that faces the light-guide second main-surface of the light guide plate, and a second light reflection main-surface that is opposed to the second light-reflecting connection surface, and wherein an interface between the interposition member and the second light-reflection member on the second light reflection main-surface is located outside an end surface of the accommodation space in a vertical cross-sectional view.

16. The light emitting module according to claim 2, comprising a plurality of light emitting element units and a plurality of interposition members as the light emitting element unit and the interposition member, wherein the light guide plate defines a plurality of accommodation spaces as the accommodation space, wherein each of the plurality of accommodation spaces accommodates a corresponding light emitting element unit and a corresponding interposition member, and wherein an interface between the interposition member and the second light-reflection member is inclined in a vertical cross-sectional view and includes an inclined surface of the interposition member.

17. The light emitting module according to claim 4,
wherein the light emitting element unit has a roughly rectangular shape in a plan view, and
wherein the interposition member has a width at an end of a side of the rectangular light emitting element unit smaller than in a central part of the side, which is located between the end and another end of the side, in a plan view.

18. The light emitting module according to claim 4,
wherein the second light-reflection member includes a second light-reflecting connection surface that faces the light-guide second main-surface of the light guide plate, and a second light reflection main-surface that is opposed to the second light-reflecting connection surface, and
wherein an interface between the interposition member and the second light-reflection member on the second light reflection main-surface is located outside an end surface of the light-transmissive member in a vertical cross-sectional view.

19. The light emitting module according to claim 4,
wherein the second light-reflection member includes a second light-reflecting connection surface that faces the light-guide second main-surface of the light guide plate, and a second light reflection main-surface that is opposed to the second light-reflecting connection surface, and
wherein an interface between the interposition member and the second light-reflection member on the second light reflection main-surface is located outside an end surface of the accommodation space in a vertical cross-sectional view.

20. The light emitting module according to claim 4, comprising a plurality of light emitting element units and a plurality of interposition members as the light emitting element unit and the interposition member,
wherein the light guide plate defines a plurality of accommodation spaces as the accommodation space, wherein each of the plurality of accommodation spaces accommodates a corresponding light emitting element unit and a corresponding interposition member, and
wherein an interface between the interposition member and the second light-reflection member is inclined in a vertical cross-sectional view and includes an inclined surface of the interposition member.

* * * * *